(12) United States Patent
Yasui et al.

(10) Patent No.: US 7,554,600 B2
(45) Date of Patent: Jun. 30, 2009

(54) LENS-BARREL AND IMAGE PICKUP APPARATUS

(75) Inventors: Tomohiro Yasui, Tokyo (JP); Masanori Hayashi, Chiba (JP); Kentaro Tashita, Gifu (JP); Yoshikazu Ito, Gifu (JP); Hideki Yamaoka, Gifu (JP)

(73) Assignee: Sony Corporation, Tokyo (JP)

( * ) Notice: Subject to any disclaimer, the term of this patent is extended or adjusted under 35 U.S.C. 154(b) by 645 days.

(21) Appl. No.: 11/207,879

(22) Filed: Aug. 22, 2005

(65) Prior Publication Data

US 2006/0044457 A1 Mar. 2, 2006

(30) Foreign Application Priority Data

Aug. 25, 2004 (JP) ............................ P2004-245631

(51) Int. Cl.
*H04N 5/225* (2006.01)
*G02B 15/14* (2006.01)
*G02B 7/04* (2006.01)

(52) U.S. Cl. .................. 348/360; 359/703; 396/144
(58) Field of Classification Search ................. 348/345, 348/357, 240.2, 240.3; 396/72, 76–79, 111, 396/144, 133; 359/694–706
See application file for complete search history.

(56) References Cited

U.S. PATENT DOCUMENTS

| 4,711,548 A | * | 12/1987 | Arakawa et al. | ............. | 396/542 |
| 5,761,546 A | * | 6/1998 | Imada | .......................... | 396/55 |
| 5,892,988 A | * | 4/1999 | Uno | ............................. | 396/72 |
| 6,985,176 B2 | * | 1/2006 | Noguchi | ................ | 348/208.11 |
| 2001/0028516 A1 | * | 10/2001 | Noguchi | ...................... | 359/823 |
| 2002/0071672 A1 | * | 6/2002 | Omiya | ........................ | 396/348 |
| 2004/0008982 A1 | * | 1/2004 | Matsuo et al. | ................. | 396/89 |
| 2006/0034594 A1 | * | 2/2006 | Yumiki et al. | ................. | 396/72 |
| 2008/0106803 A1 | * | 5/2008 | Yumiki et al. | ............... | 359/704 |

FOREIGN PATENT DOCUMENTS

| JP | 63-166293 | 7/1988 |
| JP | 63-162333 | 10/1988 |
| JP | 07-209718 | 8/1995 |
| JP | 2002-268123 | 9/2002 |
| JP | 2003-131105 | 5/2003 |
| WO | WO 2004/031826 A1 | 4/2004 |

OTHER PUBLICATIONS

Yumiki, Connection structure of the flexible substrate arranged in a camera, JP 2002-268123.*

* cited by examiner

*Primary Examiner*—Lin Ye
*Assistant Examiner*—Euel K Cowan
(74) *Attorney, Agent, or Firm*—Finnegan, Henderson, Farabow, Garrett & Dunner, LLP

(57) ABSTRACT

A main flexible substrate has a mount surface portion to be mounted to the rear surface of a base, and a movable surface portion extended from the mount surface portion. At a portion of the movable surface portion near the mount surface portion, there is provided an undulatable surface portion undulatable between a bent state of being bent relative to the mount surface portion and separate from the rear surface of the base and a flat state of being mated and mounted to the rear surface of the base. A first soldered terminal portion is formed on the front surface of the undulatable surface portion. A base end portion of a shutter flexible substrate extended to the rear side of the rear surface of the base and a base end portion of a coil flexible substrate are each provided with a second soldered terminal portion.

7 Claims, 40 Drawing Sheets

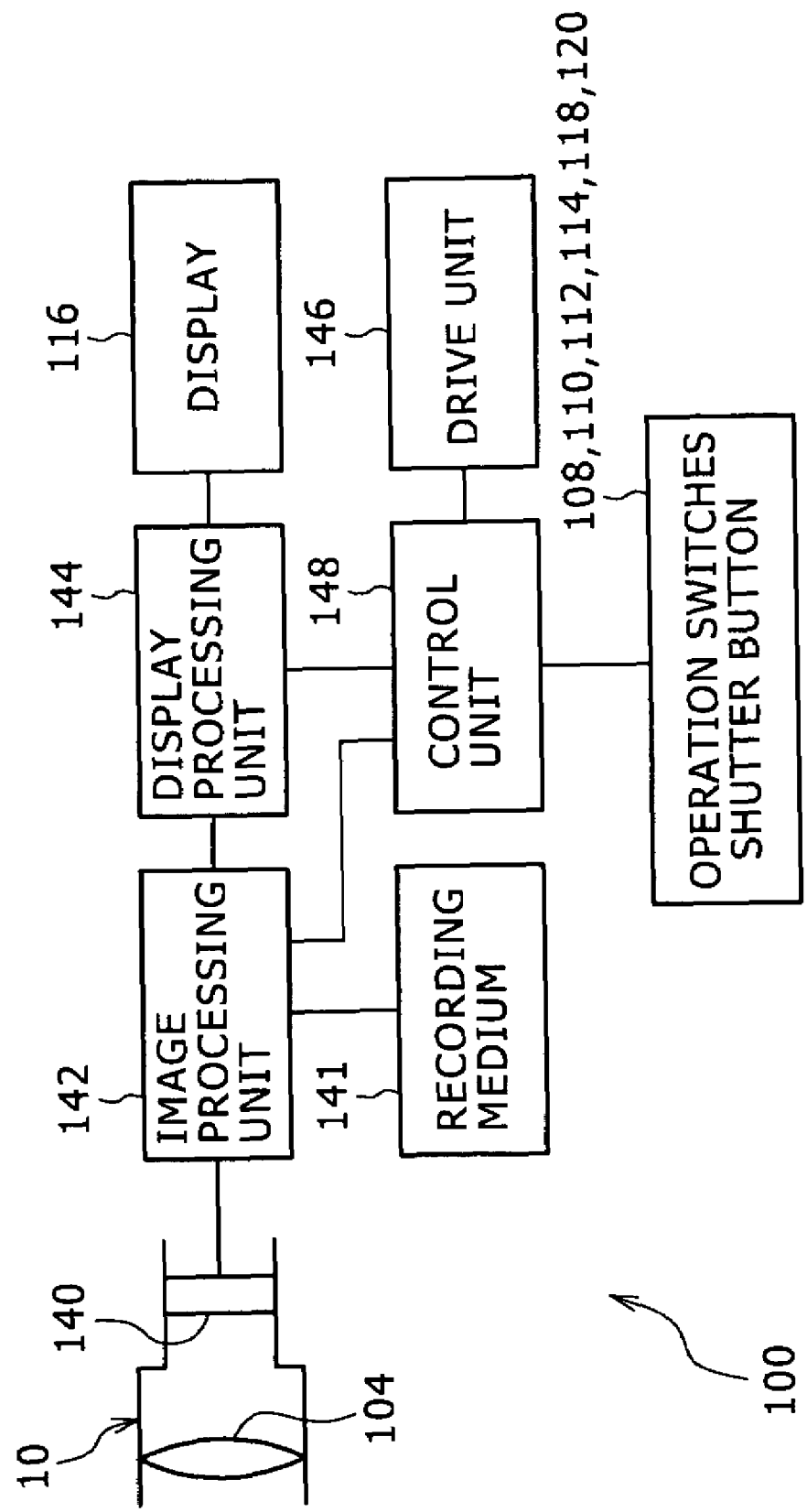

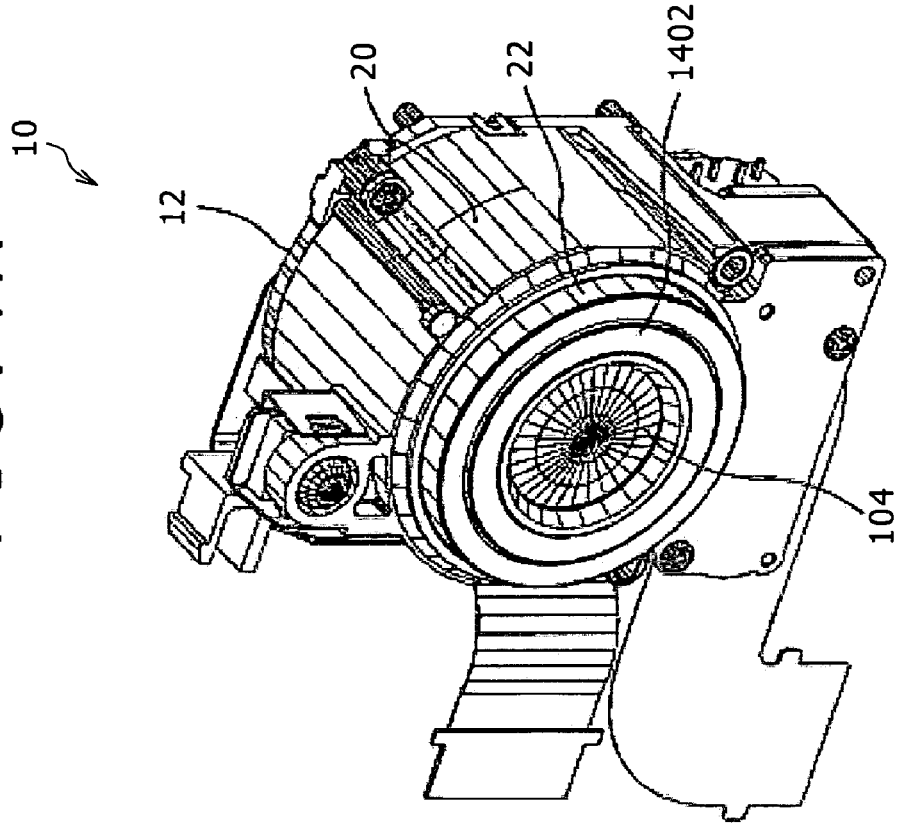
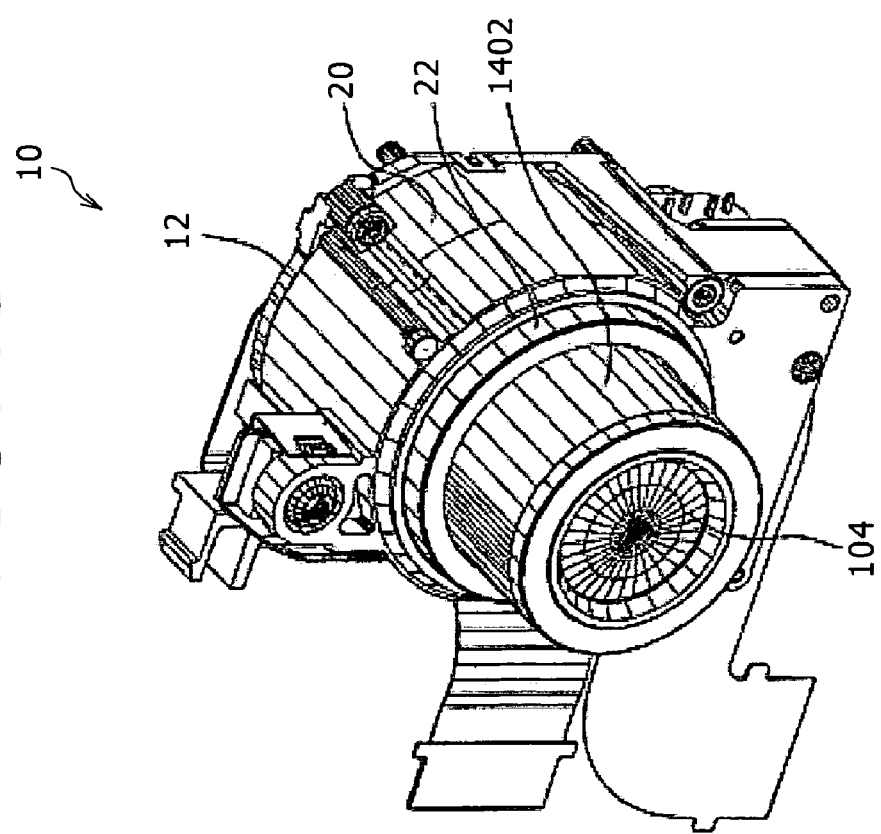

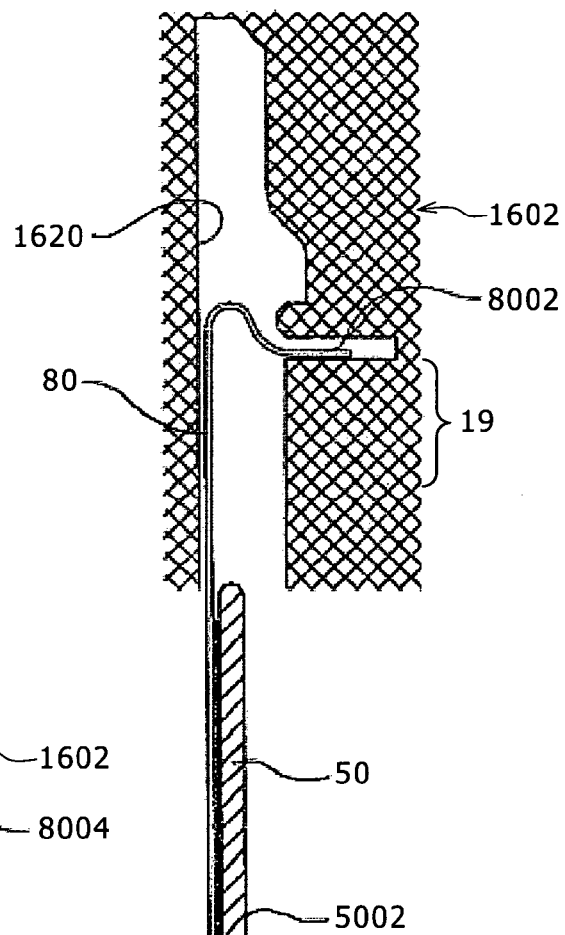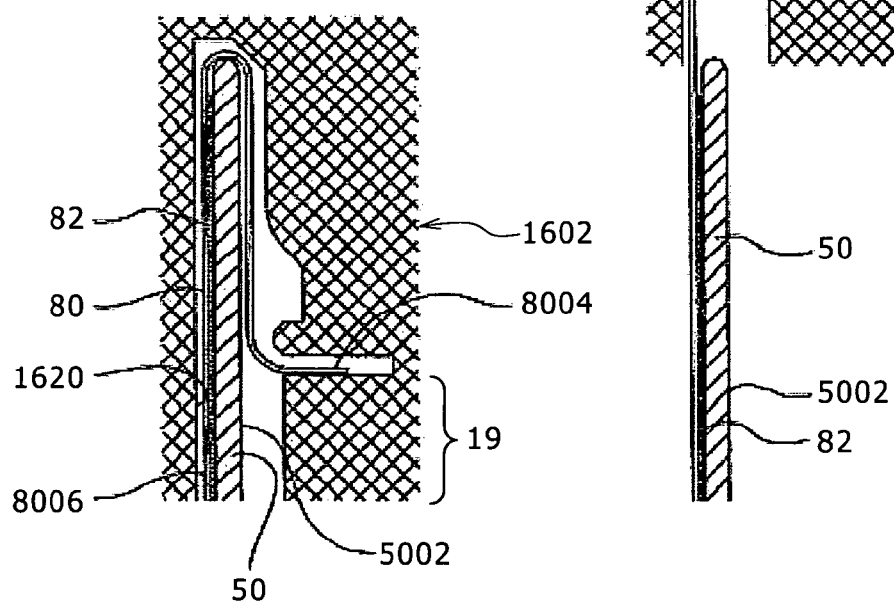

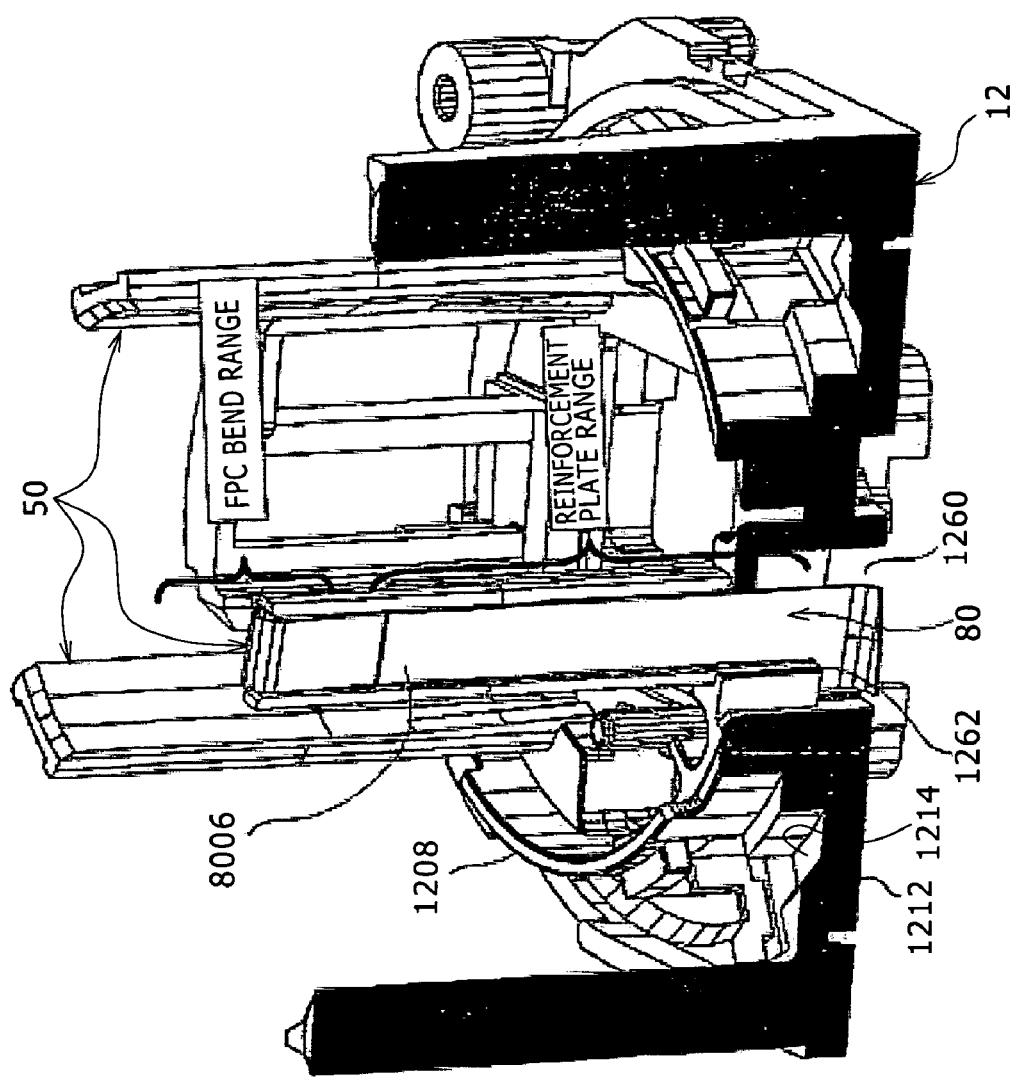

LENS-BARREL AND IMAGE PICKUP APPARATUS

BACKGROUND OF THE INVENTION

The present invention relates to a lens-barrel and an image pickup apparatus.

As a lens-barrel of an image pickup apparatus such as digital still camera and digital video camera, there are those in which an electrical equipment part operated through transfer of signals is incorporated, and there is known one in which the signals are supplied to the electrical equipment part through an electrical equipment part flexible substrate (see, for example, Japanese Patent Laid-open No. 2002-268123).

In such lens-barrels, for convenience of assembly, in many cases a configuration is adopted in which one end of the electrical equipment part flexible substrate is electrically connected to the electrical equipment part incorporated in the lens-barrel, the other end of the electrical equipment part flexible substrate is electrically connected to a main flexible substrate, other than the electrical equipment part flexible substrate, mounted to the lens-barrel, and the supply of the signals is performed through the electrical equipment part flexible substrate and the main flexible substrate, wherein the connection between the electrical equipment part flexible substrate and the main flexible substrate is conducted by soldering.

SUMMARY OF THE INVENTION

In the lens-barrel as above-mentioned, since the electrical equipment part flexible substrate and the main flexible substrate are soldered to each other, it may be necessary to apply an insulating tape so that the soldered portion would not make contact with other members, or to secure a space between the soldered portion and other members, which is disadvantageous in contriving reductions in cost and size.

In addition, it is important how to simplify the operation of soldering the electrical equipment part flexible substrate and the main flexible substrate to each other.

Thus, there is a need to provide a lens-barrel and an image pickup apparatus which are advantageous in contriving reductions in cost and size and simplification of a soldering operation, in relation to the production of a lens-barrel in which an electrical equipment part flexible substrate and a main flexible substrate are connected to each other by soldering.

In accordance with an embodiment of the present invention, there is provided a lens-barrel including: a lens holding frame for holding a lens; an electrical equipment part provided in the lens holding frame; a base provided on the rear side of the lens holding frame so as to support the lens holding frame movably in the axial direction; an electrical equipment part flexible substrate having a front end connected to the electrical equipment part and having a rear end extended rearwards from a front surface of the base to the rear side of a rear surface of the base through an opening in the base; and a main flexible substrate mounted to the rear surface of the base; the rear end of the electrical equipment part flexible substrate being connected to the main flexible substrate; wherein the main flexible substrate has a mount surface portion mounted to the rear surface of the base, and a movable surface portion extended from the mount surface portion; a portion on the mount surface portion side of the movable surface portion is provided with an undulatable surface portion undulatable between a bent state in which the undulatable surface portion is bent relative to the mount surface portion and separate from the rear surface of the base and a flat state in which the undulatable surface portion is mated and mounted to the rear surface of the base; a front surface of the undulable surface portion fronting on the rear surface of the base is provided with a first soldered terminal portion; the electrical equipment part flexible substrate is provided at the rear end thereof with a second soldered terminal portion; and the front surface of the undulatable surface portion is mounted to the rear surface of the base, and the second soldered terminal portion of the electrical equipment part flexible substrate is soldered in the state of overlapping the first soldered terminal portion of the undulatable surface portion.

In accordance with another embodiment of the present invention, there is provided an image pickup apparatus including a lens for leading an object image, and an image pickup device for shooting the object image led by the lens, wherein the lens-barrel includes: a lens holding frame for holding a lens; an electrical equipment part provided in the lens holding frame; a base provided on the rear side of the lens holding frame so as to support the lens holding frame movably in the axial direction; an electrical equipment part flexible substrate having a front end connected to the electrical equipment part and having a rear end extended rearwards from a front surface of the base to the rear side of a rear surface of the base through an opening in the base; and a main flexible substrate mounted to the rear surface of the base, the rear end of the electrical equipment part flexible substrate being connected to the main flexible substrate; in which the main flexible substrate has a mount surface portion mounted to the rear surface of the base, and a movable surface portion extended from the mount surface portion; a portion on the mount surface portion side of the movable surface portion is provided with an undulatable surface portion undulatable between a bent state in which the undulatable surface portion is bent relative to the mount surface portion and separate from the rear surface of the base and a flat state in which the undulatable surface portion is mated and mounted to the rear surface of the base; a front surface of the undulatable surface portion fronting on the rear surface of the base is provided with a first soldered terminal portion; the electrical equipment part flexible substrate is provided at the rear end thereof with a second soldered terminal portion; and the front surface of the undulatable surface portion is mounted to the rear surface of the base, and the second soldered terminal portion of the electrical equipment part flexible substrate is soldered in the state of overlapping the first soldered terminal portion of the undulatable surface portion.

According to the present invention, the main flexible substrate is provided with the undulatable surface portion, the front surface of the undulatable surface portion fronting on the rear surface of the base is provided with the first soldered terminal portion, and the electrical equipment part flexible substrate is provided at its rear end with the second soldered terminal portion, so that the second soldered terminal portion of the electrical equipment part flexible substrate can be soldered in the state of overlapping the first soldered terminal portion of the undulatable surface portion in the condition where the undulatable surface portion is in the bent state, which is advantageous in simplifying the assembling operation.

In addition, when the undultable surface portion is set in the flat state, the solder is covered by the main flexible substrate and is not exposed to the outside. Therefore, unlike in the related art, there is no need to secure a space for preventing the soldered portion from making contact with other members, which is advantageous in contriving a reduction in size. Besides, there is no need to apply such a member as an insulating tape to the soldered portion, which is advantageous in contriving reductions in the number of component parts and in cost.

BRIEF DESCRIPTION OF THE DRAWINGS

FIG. 3 is a block diagram showing the configuration of the image pickup apparatus according to Example 1;

FIGS. 4A and 4B are perspective views for illustrating the condition of a lens-barrel 10, in which FIG. 4A shows the lens storing condition, i.e., the barrel retracted condition, at non-use time, and FIG. 4B shows the lens projecting condition (wide angle condition or telephoto condition) at use time;

FIG. 34A is an illustration showing the condition of the shutter flexible substrate 80 in the barrel retracted condition, and FIG. 34B is an illustration showing the condition of the shutter flexible substrate 80 in the wide angle condition;

FIG. 35 is a perspective view showing the laying around of the shutter flexible substrate 80;

FIGS. 38A and 38B are sectional views along line A-A of FIG. 37, in which FIG. 38A shows the bent state of an undulatable surface portion of the main flexible substrate 60, and FIG. 38B shows the flat state of the undulatable surface portion of the main flexible substrate 60;

DETAILED DESCRIPTION OF THE PREFERRED EMBODIMENTS

Figure 1:
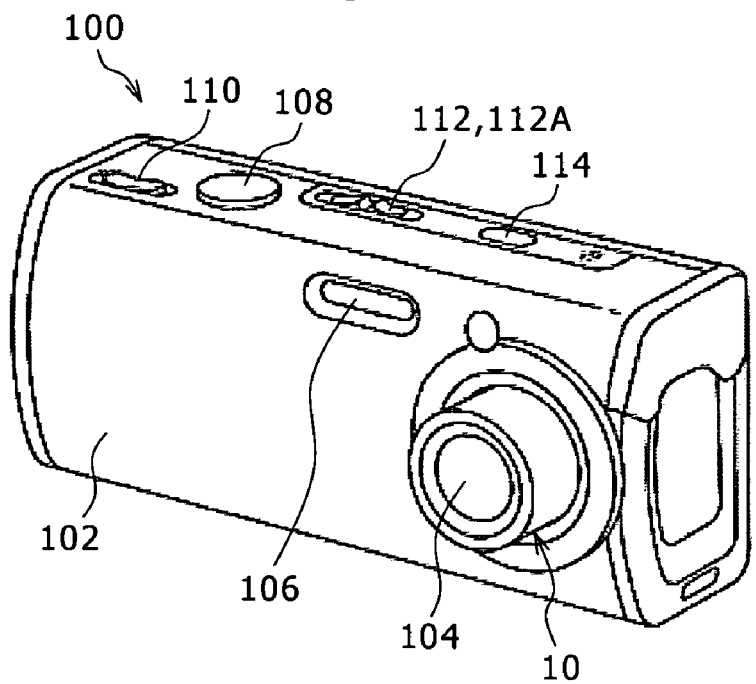
FIG. 1 is a perspective view, from the front side, of an image pickup apparatus according to Example 1.

In response to the need to contrive reductions in cost and size and simplification of the soldering operation, according to the present invention, there is adopted a configuration in which a first soldered terminal portion of an undulatable portion provided in a main flexible substrate and a second soldered terminal portion provided at the rear end of an electrical equipment part flexible substrate are overlappingly soldered onto each other.

EXAMPLE 1

Now, Example 1 of the present invention will be described below referring to the drawings.

Figure 2:
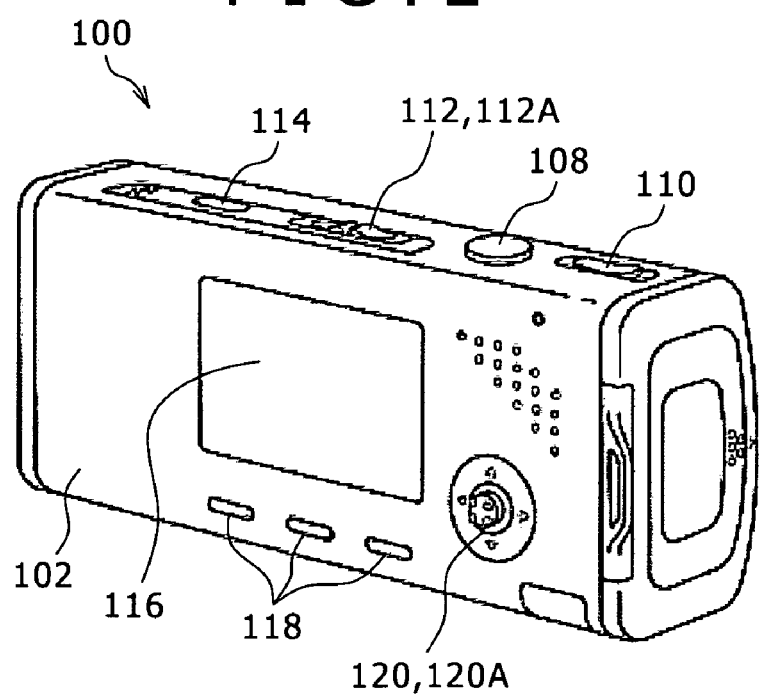
FIG. 2 is a perspective view, from the rear side, of the image pickup apparatus according to Example 1.

FIG. 1 is a perspective view, from the front side, of an image pickup apparatus according to Example 1, FIG. 2 is a perspective view, from the rear side, of the image pickup apparatus according to Example 1, and FIG. 3 is a block diagram showing the configuration of the image pickup apparatus according to Example 1.

As shown in FIG. 1, the image pickup apparatus 100 according to Example 1 is a digital still camera, and has a case 102 constituting the armor. Incidentally, the left and right herein means the left and right of the image pickup apparatus 100 as viewed from the front side; besides, in the optical axis direction of the optical-system, the object side will be referred to as the front side, and the image pickup device side will be referred to as the rear side.

A barrel retraction type lens-barrel 10 for storing and holding an image pickup optical system 104 is provided at a portion near a right side portion of the front surface of the case 102, and a flash portion 106 for emitting flash light and the like are provided at a portion near an upper portion of the front surface of the case 102.

The lens-barrel 10 is so configured as to be projected and retracted between a use position (a wide angle condition, a telephoto condition, and an intermediate condition between the wide angle and telephoto conditions) where it is projected forwards from the front surface of the case 102 by a drive unit 146 (FIG. 3) incorporated in the case 102 and a stored position (a barrel retracted condition) where it is stored in the front surface of the case 102.

A shutter button 108 for an image pickup operation, a zoom operation switch 110 for regulating the zoom of the image pickup optical system 104, a mode changeover switch 112 for changing over the reproduction mode or the like, and a power supply switch 114 for turning a power supply ON and OFF are provided at an upper end surface of the case 102, whereas a display 116 for displaying a video image picked up, a plurality of operation switches 118 for performing operations related to various actions such as image pickup (shooting), recording, and video image display, a control switch 120 for performing operations such as selection from menu displayed on the display 116, and the like are provided at a rear surface of the case 102.

In this example, the mode changeover switch 112 is composed of a so-called slide switch, which has an operating member 112A projecting from the upper end surface of the case 102, and mode changeover operations are effected by sliding the operating member 112A in the left-right direction by a finger.

In addition, the control switch 120 has an operating member 120A projecting rearwards from the rear surface of the case 102. The operating member 120A is so configured that it can be tilted in four senses in the vertical direction and the left-right direction by moving a tip end surface thereof by a finger and that the tip end surface thereof can be pushed in the thickness direction of the case 102.

Specifically, the control switch 120 is so configured that, by moving the operating member 120A in the vertical direction and the left-right direction, for example, the position of a cursor displayed on the display 116 can be moved in the vertical direction and the left-right direction, and numerical values and the like displayed on the display 116 can be changed (increased and decreased). In addition, the control switch 120 is so configured that, by depressing the operating member 120A, it is possible to determine a plurality of selection items (menu) displayed on the display 116 and to input numerical values displayed in input columns displayed on the display 116.

As shown in FIG. 3, an image pickup device 140 composed of a CCD, a CMOS sensor or the like for shooting an object image formed by the image pickup optical system 104 is disposed at a rear portion of the lens-barrel 10. The image pickup device 40 includes an image processing unit 142 for generating image data based on an image pickup signal outputted from the image pickup device 140 and recording the data into a recording medium 141 such as a memory card, a display processing unit 144 for displaying the image data on the display 116, the above-mentioned drive unit 146, a control unit 148 and the like. The control unit 148 is for controlling the image processing unit 142, the display processing unit 144, and the drive unit 146 according to the operations on the shutter button 108, the zoom operation switch 110, the mode changeover switch 112, the power supply switch 114, the operation switches 118, and the control switch 120, and has a CPU for performing actions according to a control program.

Now, general configuration of the lens-barrel 10 will be described below.

FIGS. 4A and 4B are perspective views for illustrating the condition of the lens-barrel 10, in which FIG. 4A shows the lens storing condition, i.e., the barrel retracted condition, at non-use time, and FIG. 4B shows the lens projecting condition (wide angle condition or telephoto condition) at use time.

Figure 5:
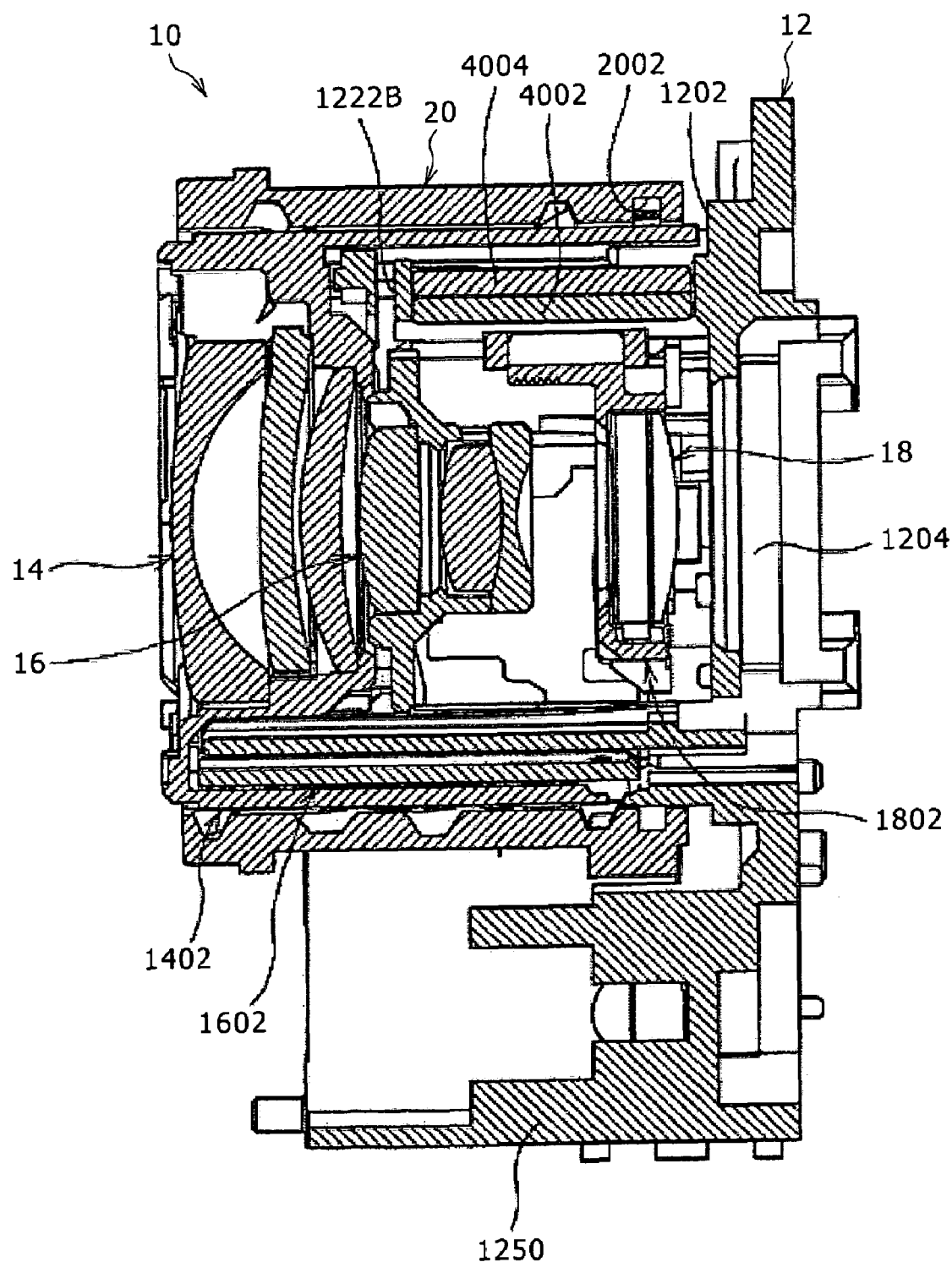
FIG. 5 is a sectional view of the lens-barrel 10 in the barrel retracted condition.
Figure 6:
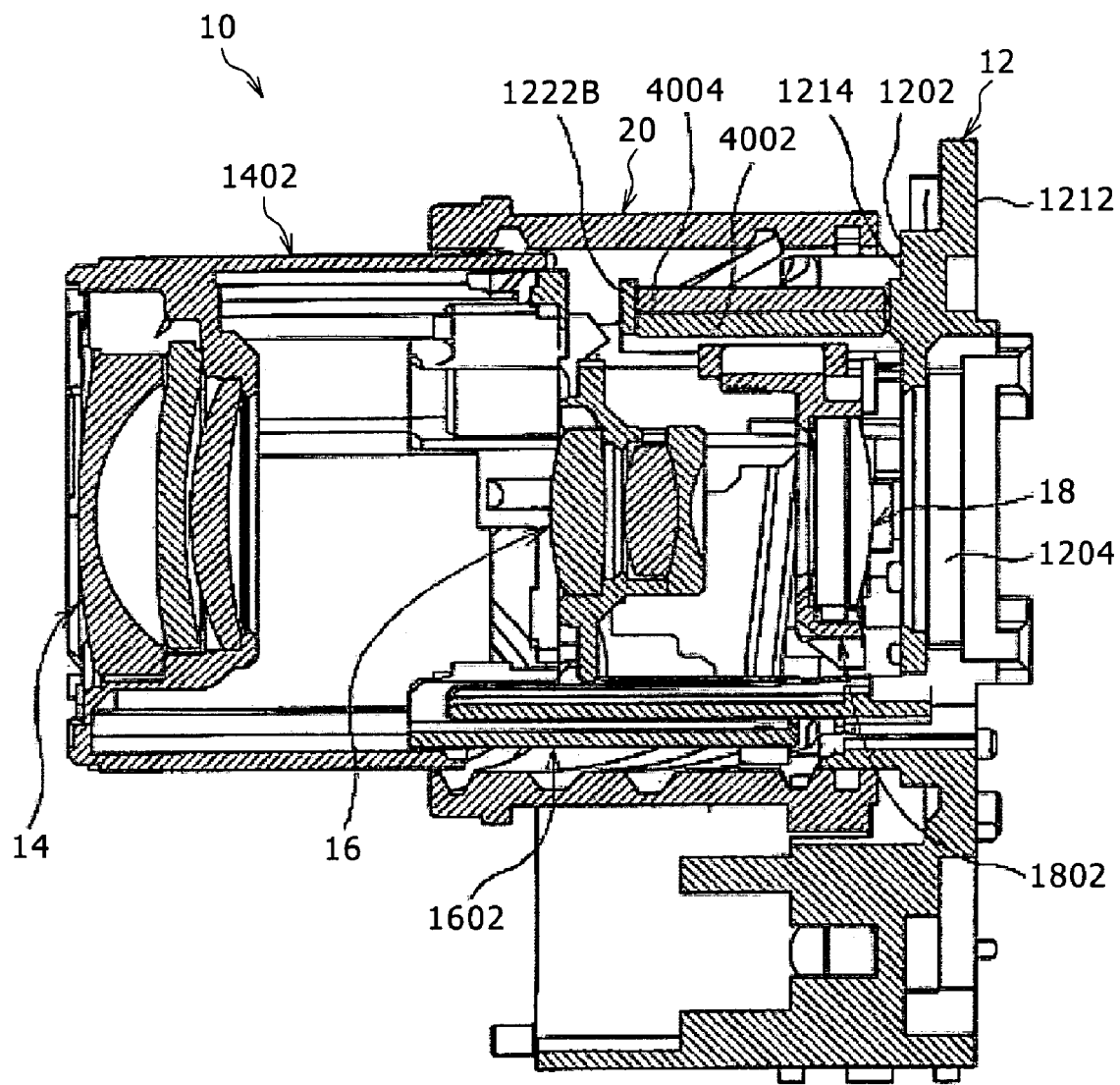
FIG. 6 is a sectional view of the lens-barrel 10 in the wide angle condition.
Figure 7:
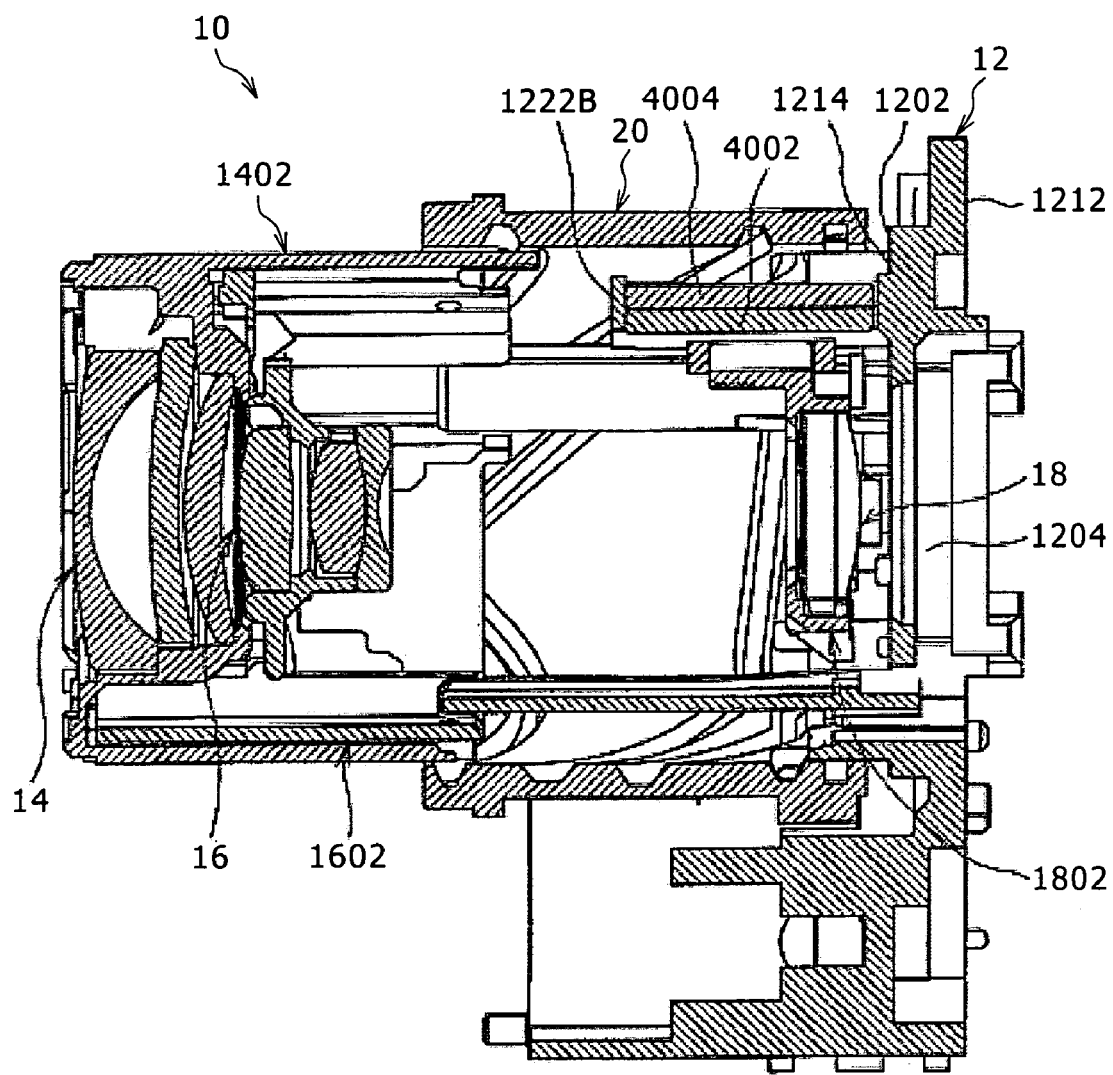
FIG. 7 is a sectional view of the lens-barrel 10 in the telephoto condition.

FIG. 5 is a sectional view of the lens-barrel 10 in the barrel retracted condition, FIG. 6 is a sectional view of the lens-barrel 10 in the wide angle condition, and FIG. 7 is a sectional view of the lens-barrel 10 in the telephoto condition.

Figure 8:
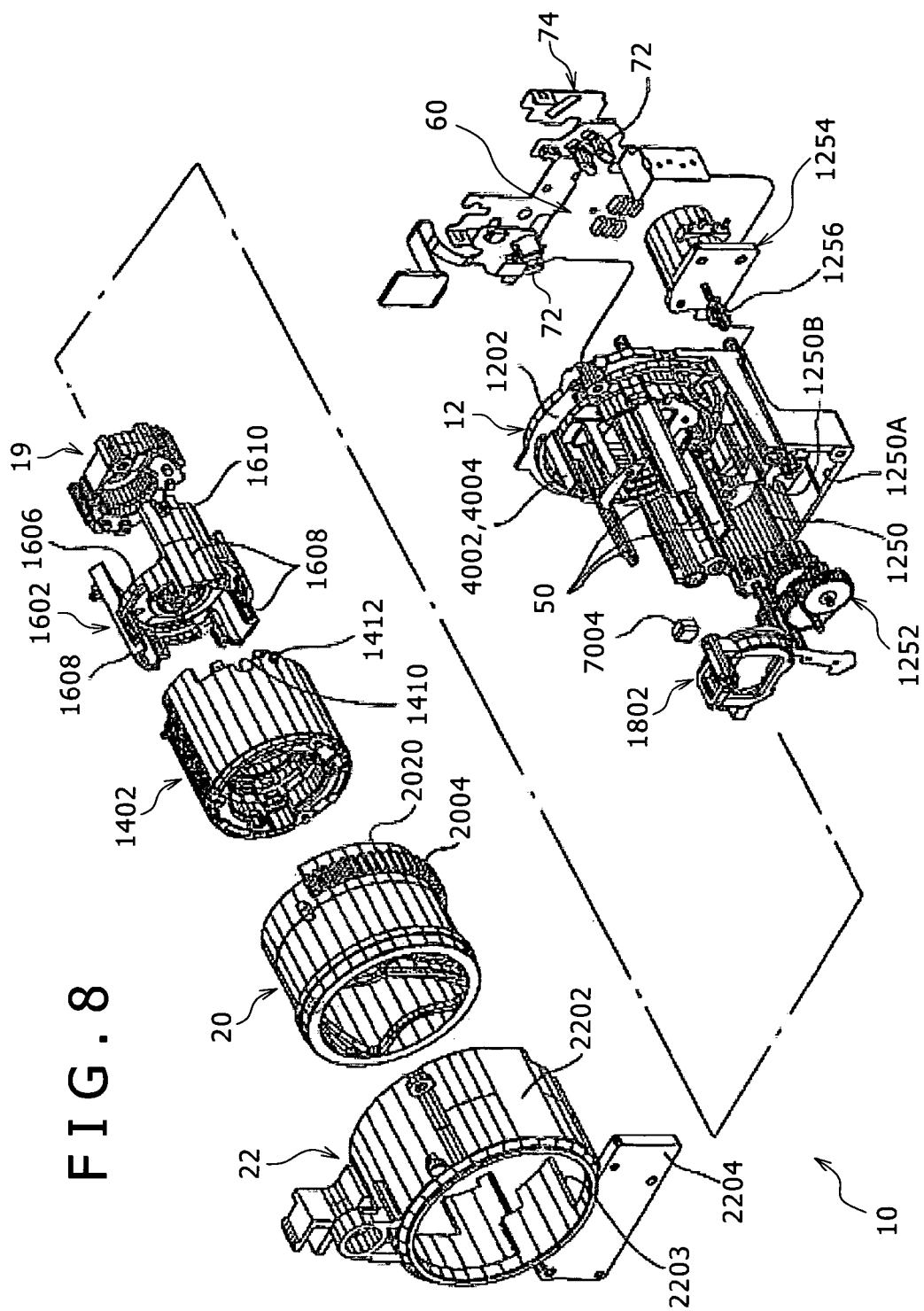
FIG. 8 is an exploded perspective view, from the front side, of the lens-barrel 10.
Figure 9:
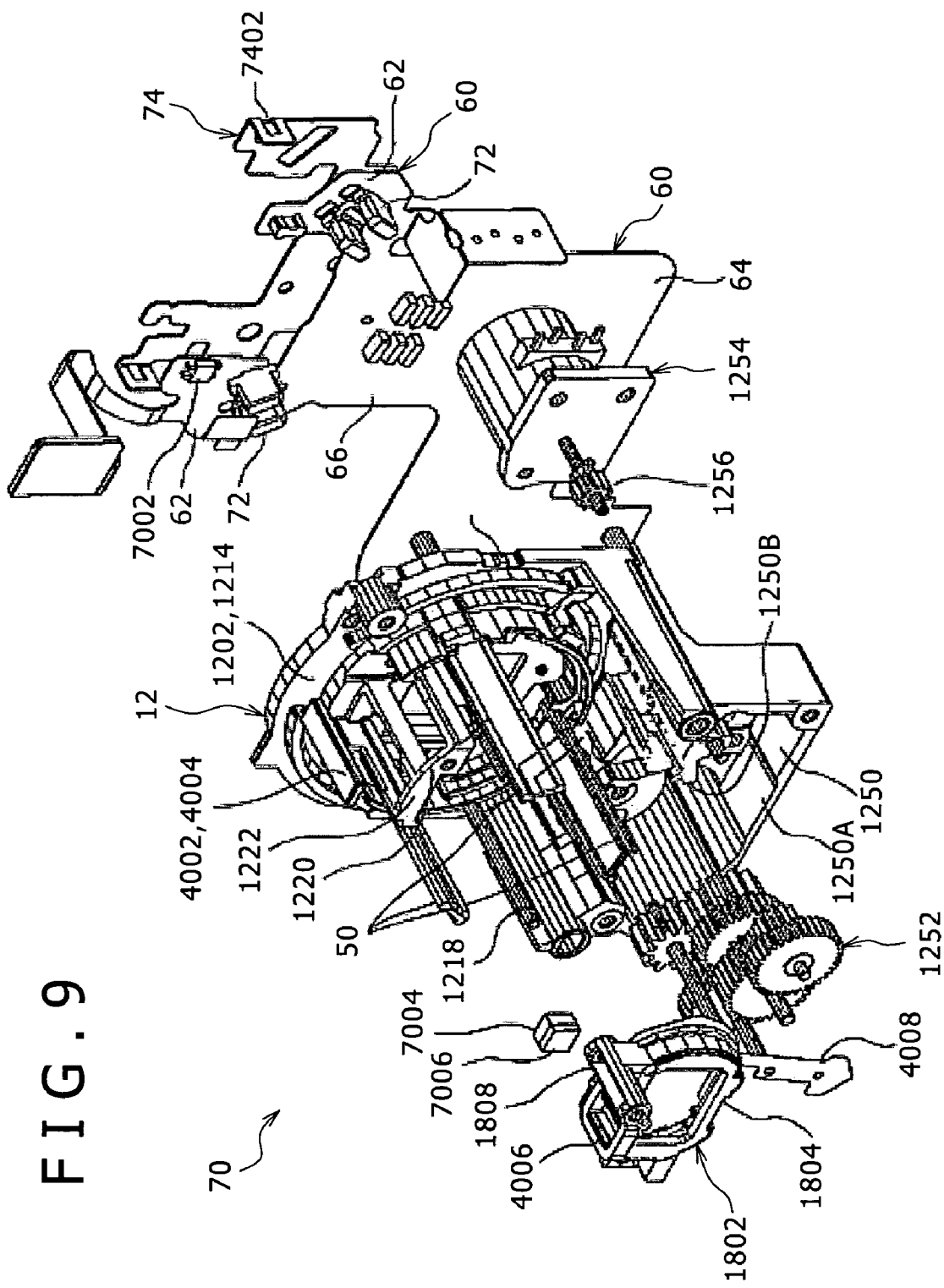
FIG. 9 is an exploded perspective view showing a third lens holding frame, a base, and a flexible substrate shown in FIG. 8.
Figure 10:
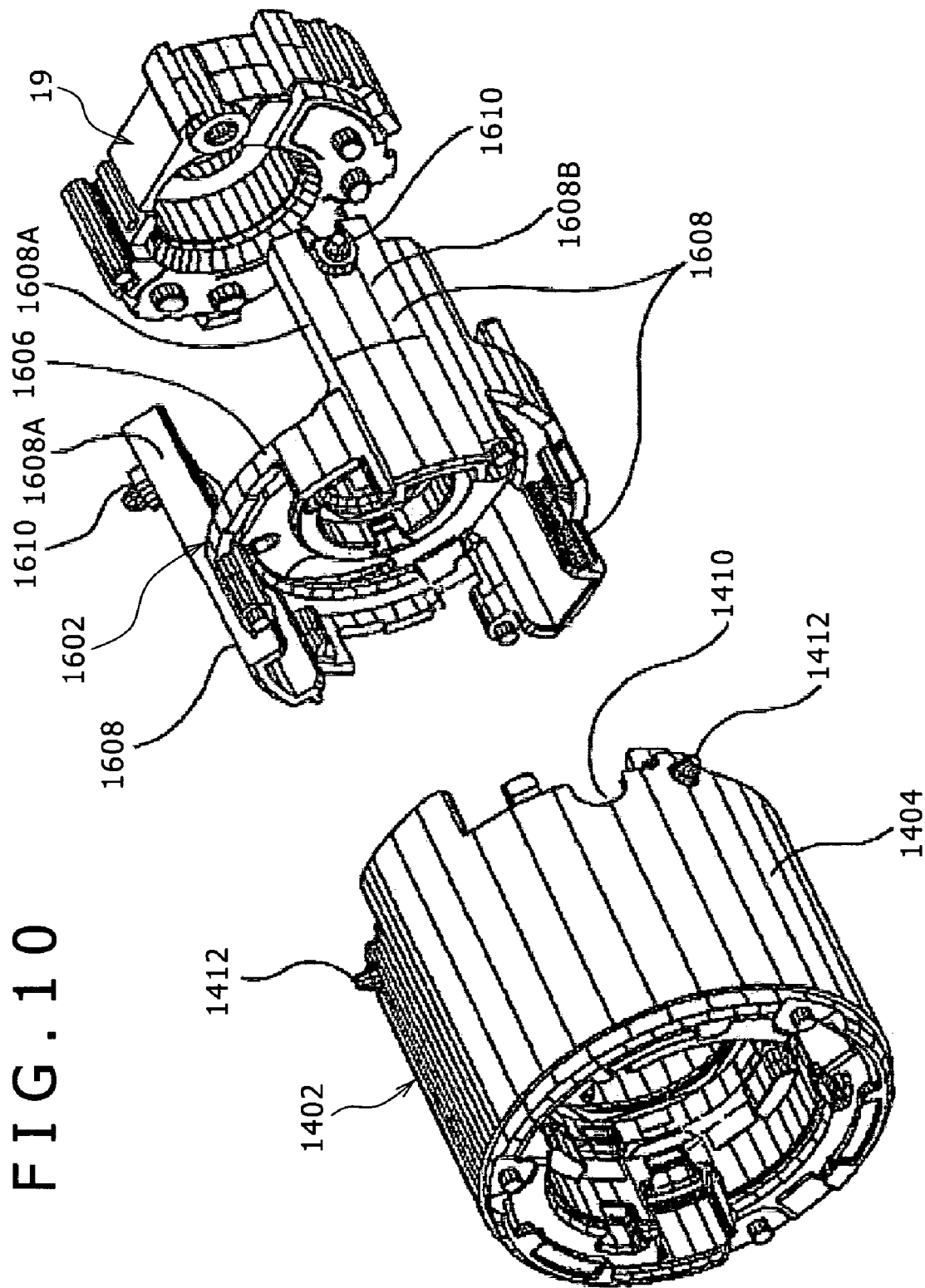
FIG. 10 is an exploded perspective view showing a first lens holding frame, a second lens holding frame, and an automatic exposure device shown in FIG. 8.
Figure 11:
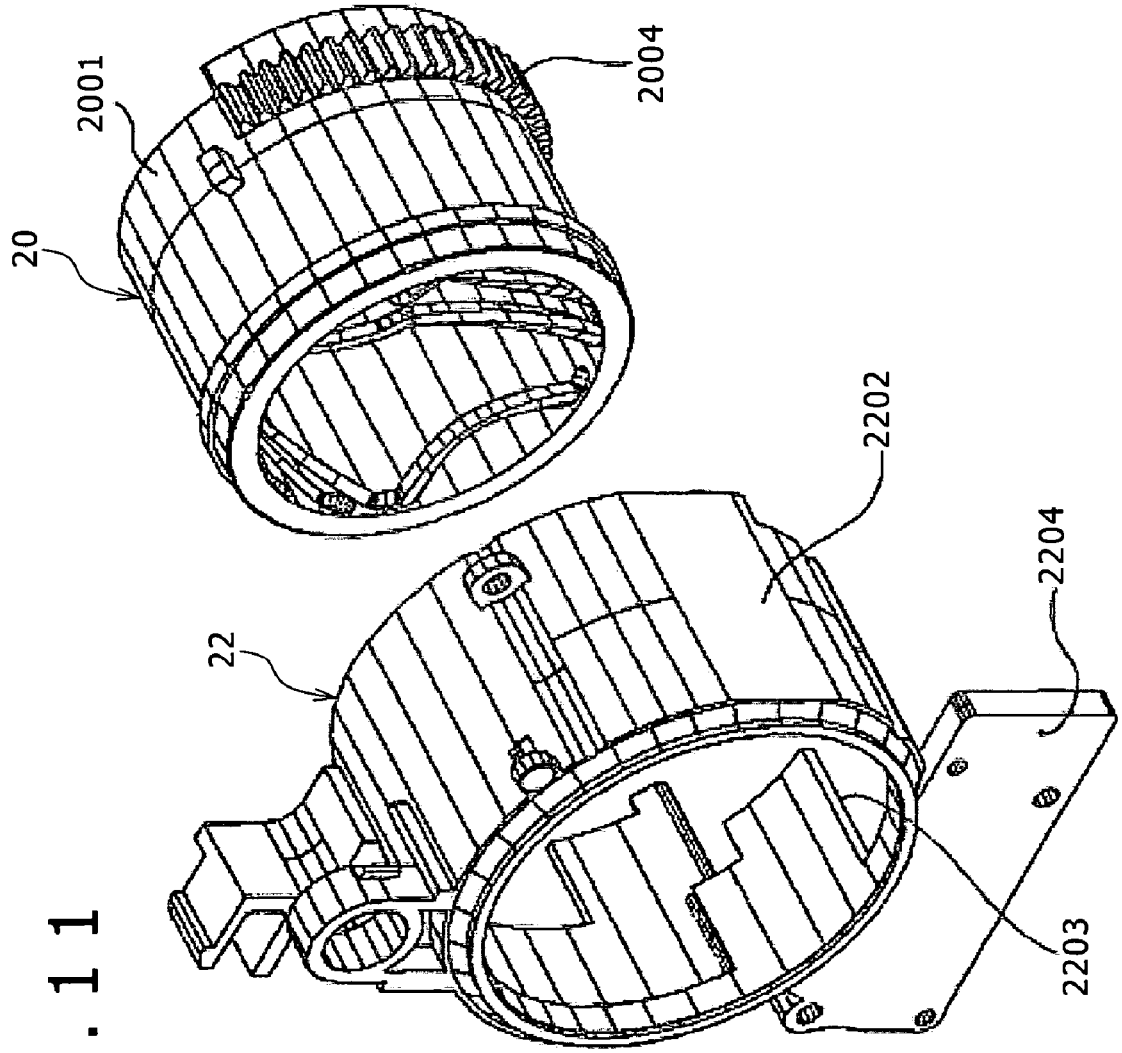
FIG. 11 is an exploded perspective view showing a fixed ring, and a cam ring shown in FIG. 8.

FIG. 8 is an exploded perspective view, from the front side, of the lens-barrel 10, FIG. 9 is an exploded perspective view showing a third lens holding frame, a base, and a flexible substrate shown in FIG. 8, FIG. 10 is an exploded perspective view showing a first lens holding frame, a second lens holding frame, and an automatic exposure device shown in FIG. 8, and FIG. 11 is an exploded perspective view showing a fixed ring, and a cam ring shown in FIG. 8.

Figure 12:
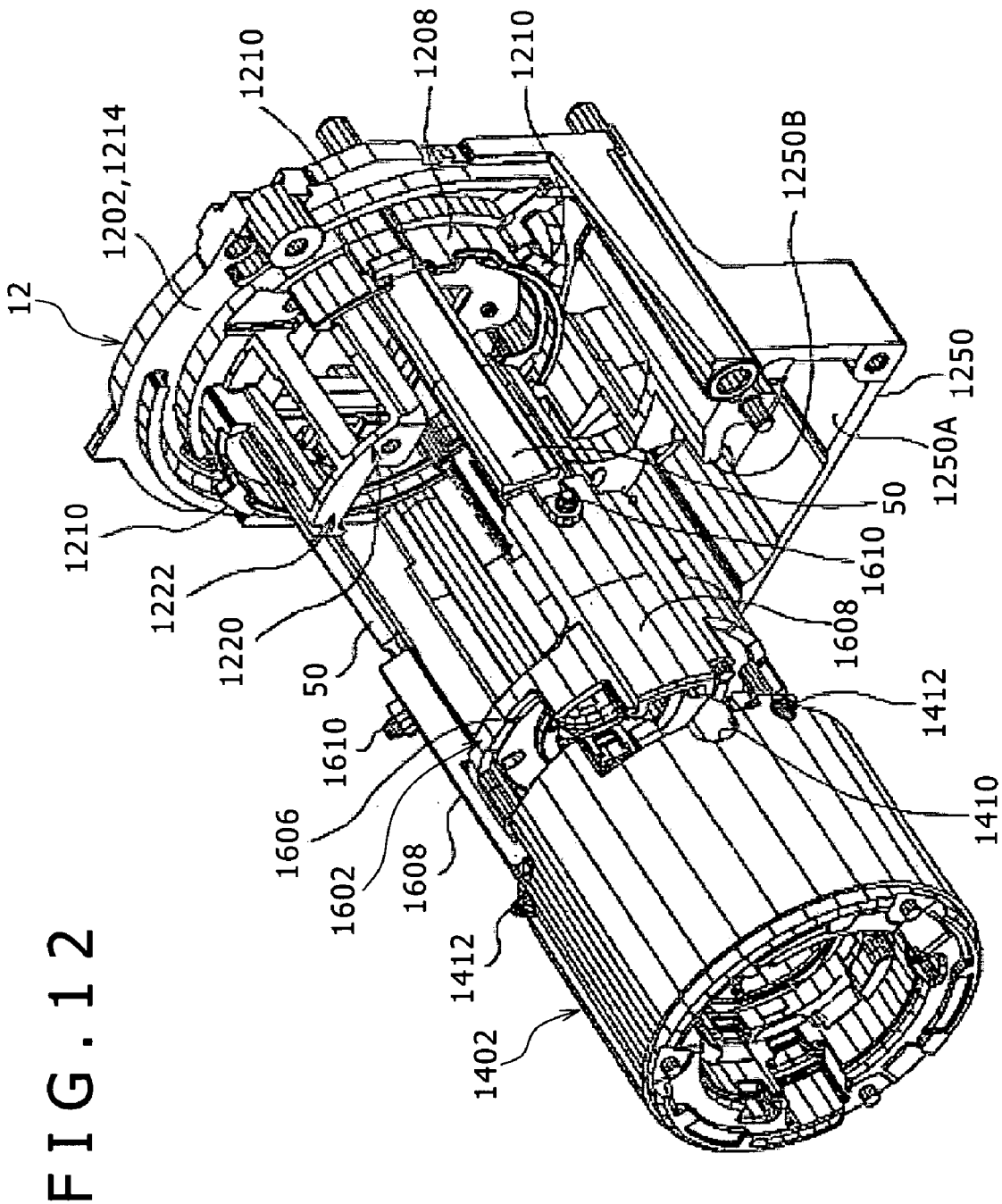
FIG. 12 is an exploded perspective view showing the first lens holding frame, the second lens holding frame, and the base.
Figure 13:
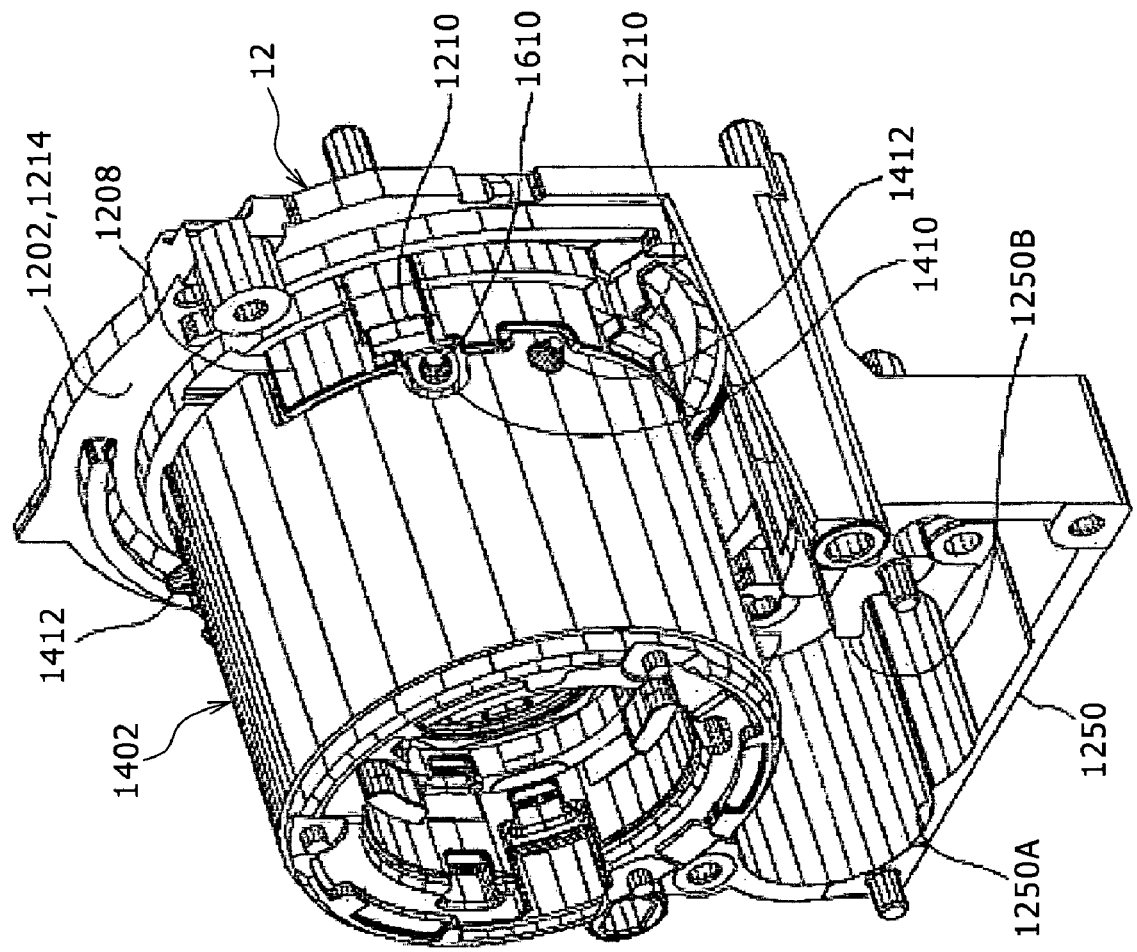
FIG. 13 is an assembly diagram of FIG. 12.
Figure 14:
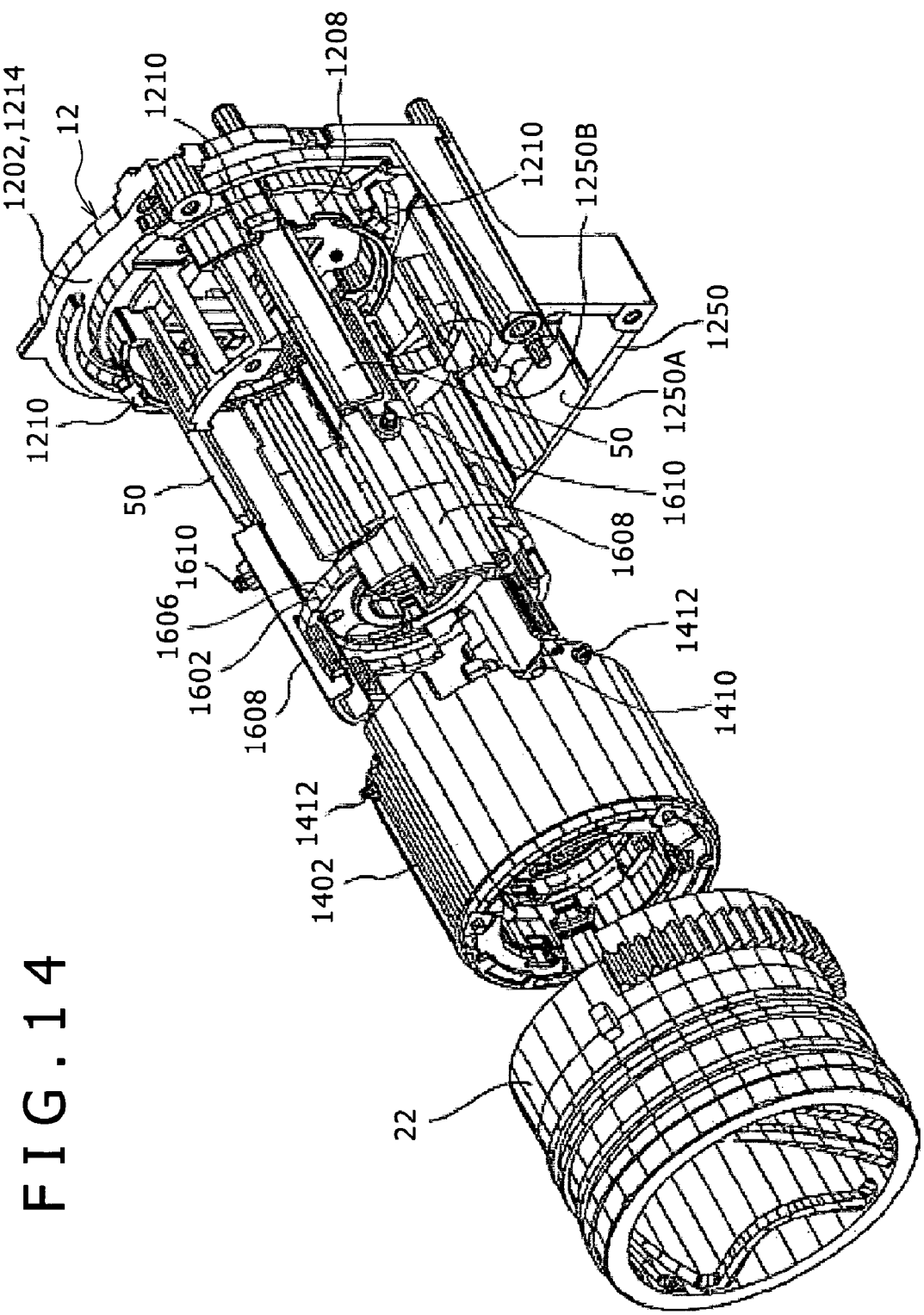
FIG. 14 is an exploded perspective view showing the cam ring, the first lens holding frame, the second lens holding frame, and the base.
Figure 15:
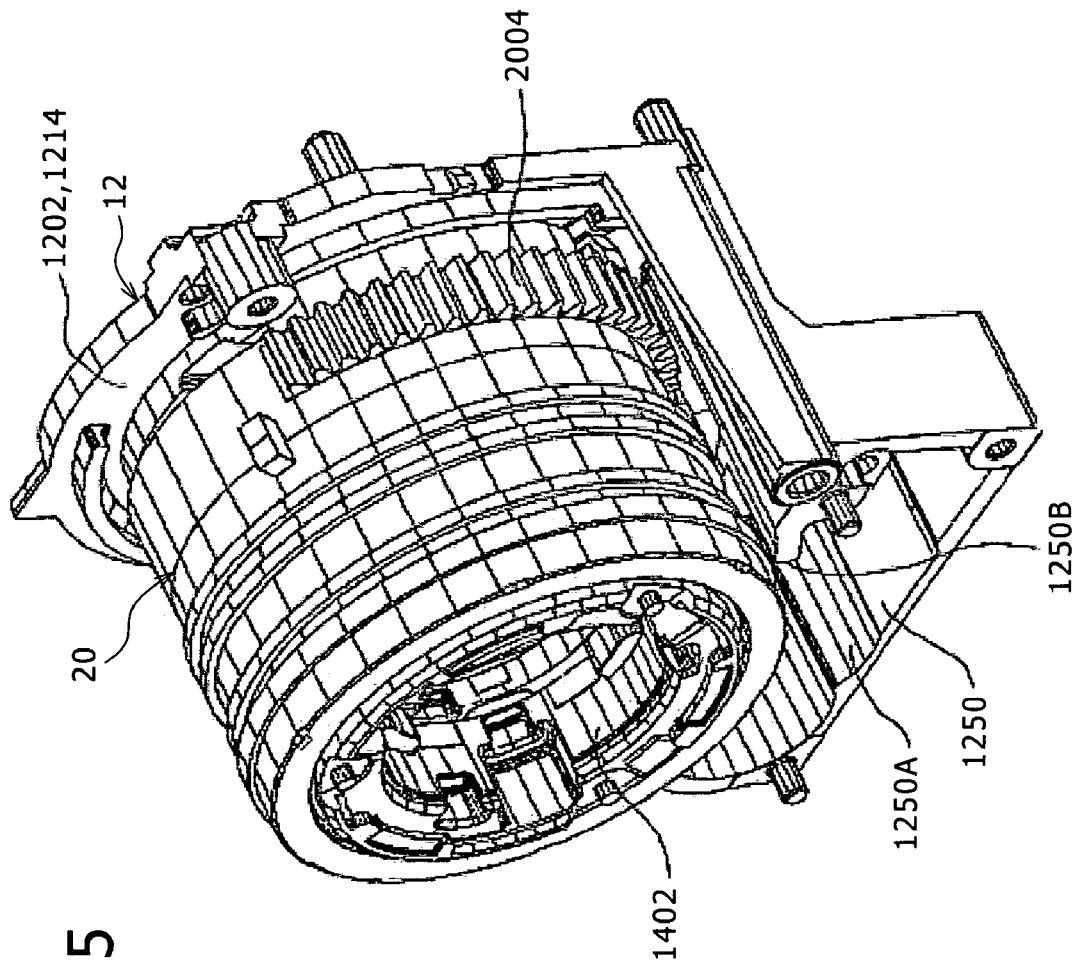
FIG. 15 is an assembly diagram of FIG. 14.

FIG. 12 is an exploded perspective view showing the first lens holding frame, the second lens holding frame, and the base, FIG. 13 is an assembly diagram of FIG. 12, FIG. 14 is an exploded perspective view showing the cam ring, the first lens holding frame, the second lens holding frame, and the base, and FIG. 15 is an assembly diagram of FIG. 14.

Figure 16:
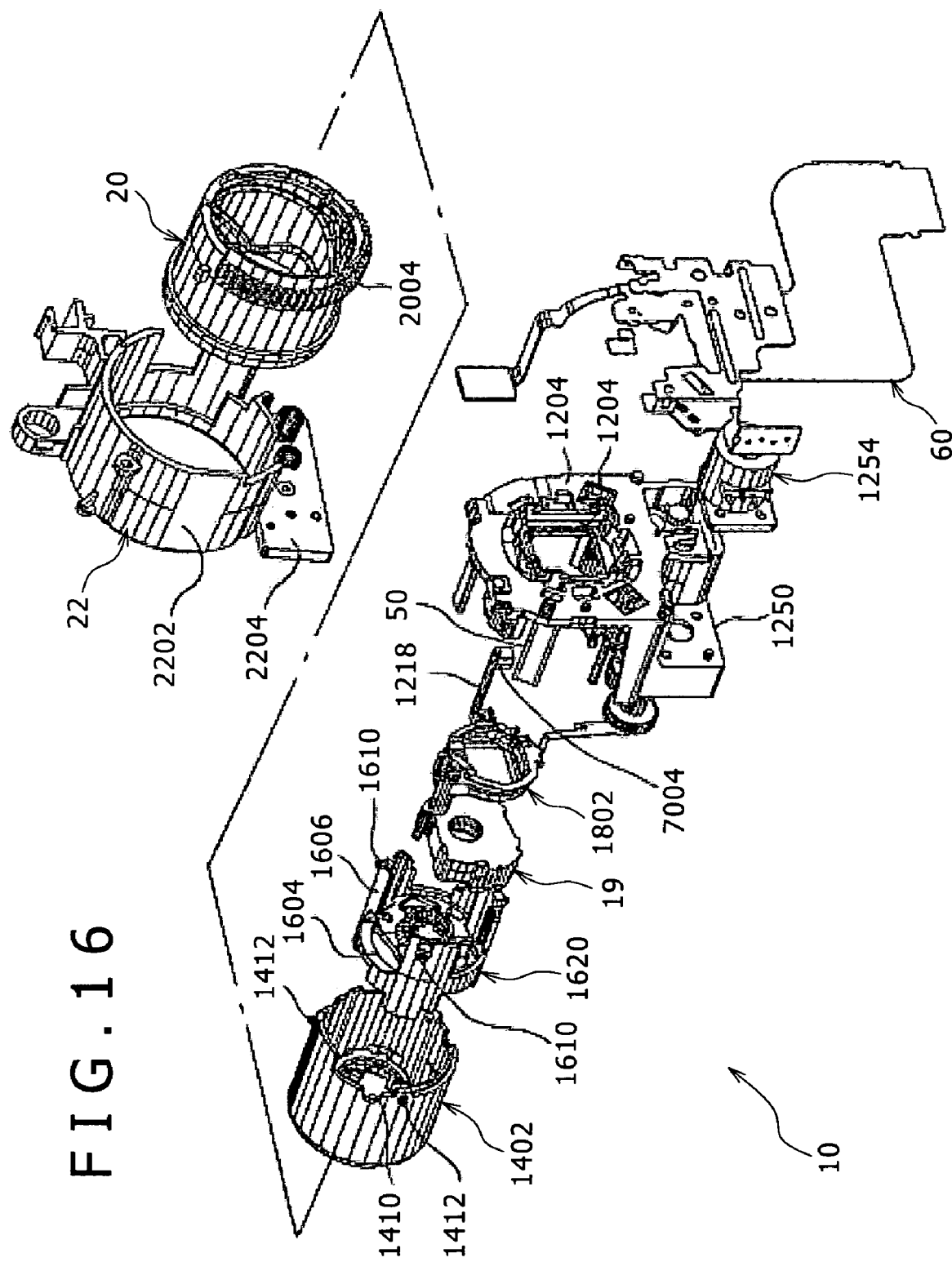
FIG. 16 is an exploded perspective view, from the rear side, of the lens-barrel 10.
Figure 17:
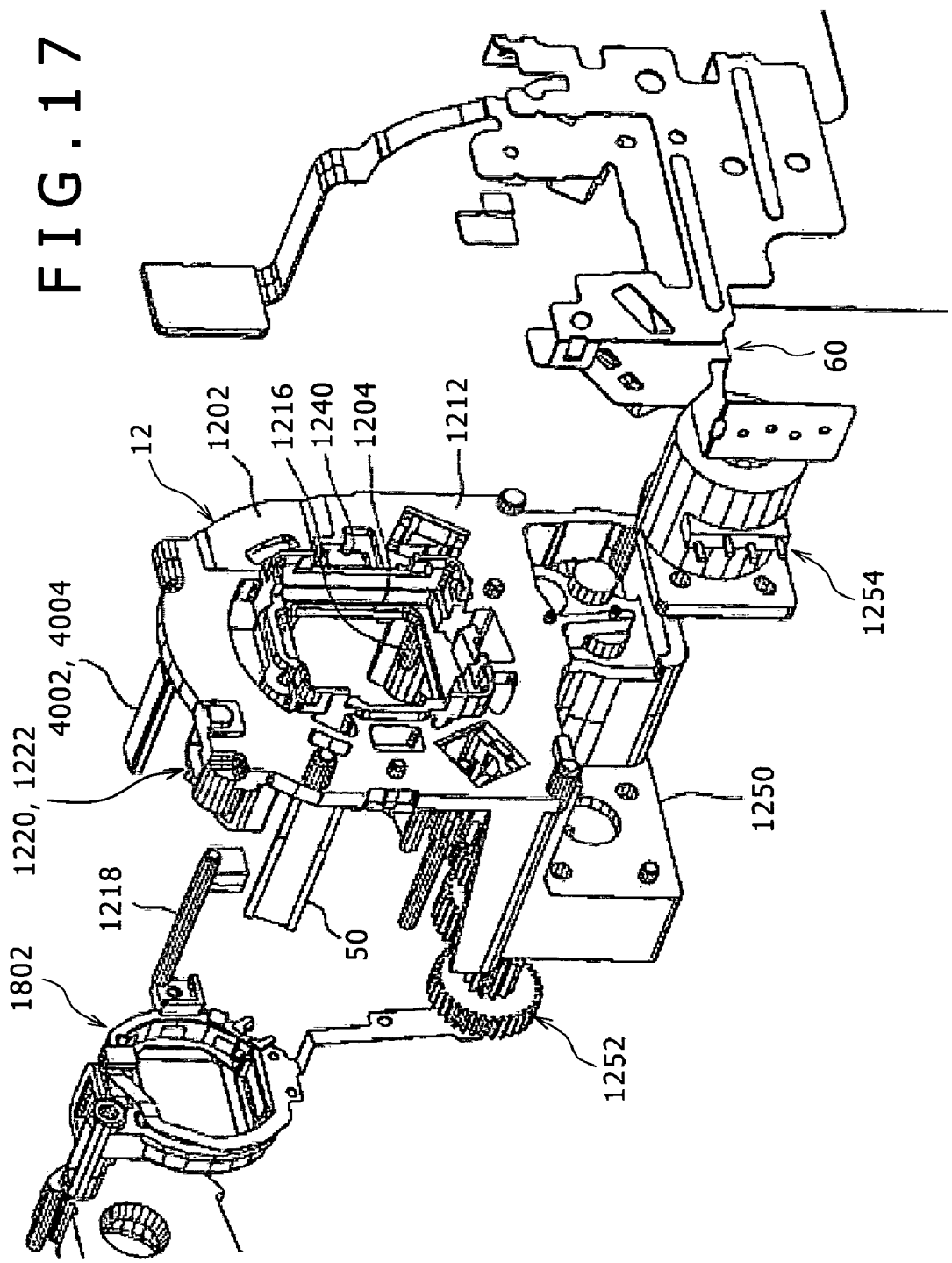
FIG. 17 is an exploded perspective view showing the third lens holding frame, the base, and the flexible substrate shown in FIG. 16.
Figure 18:
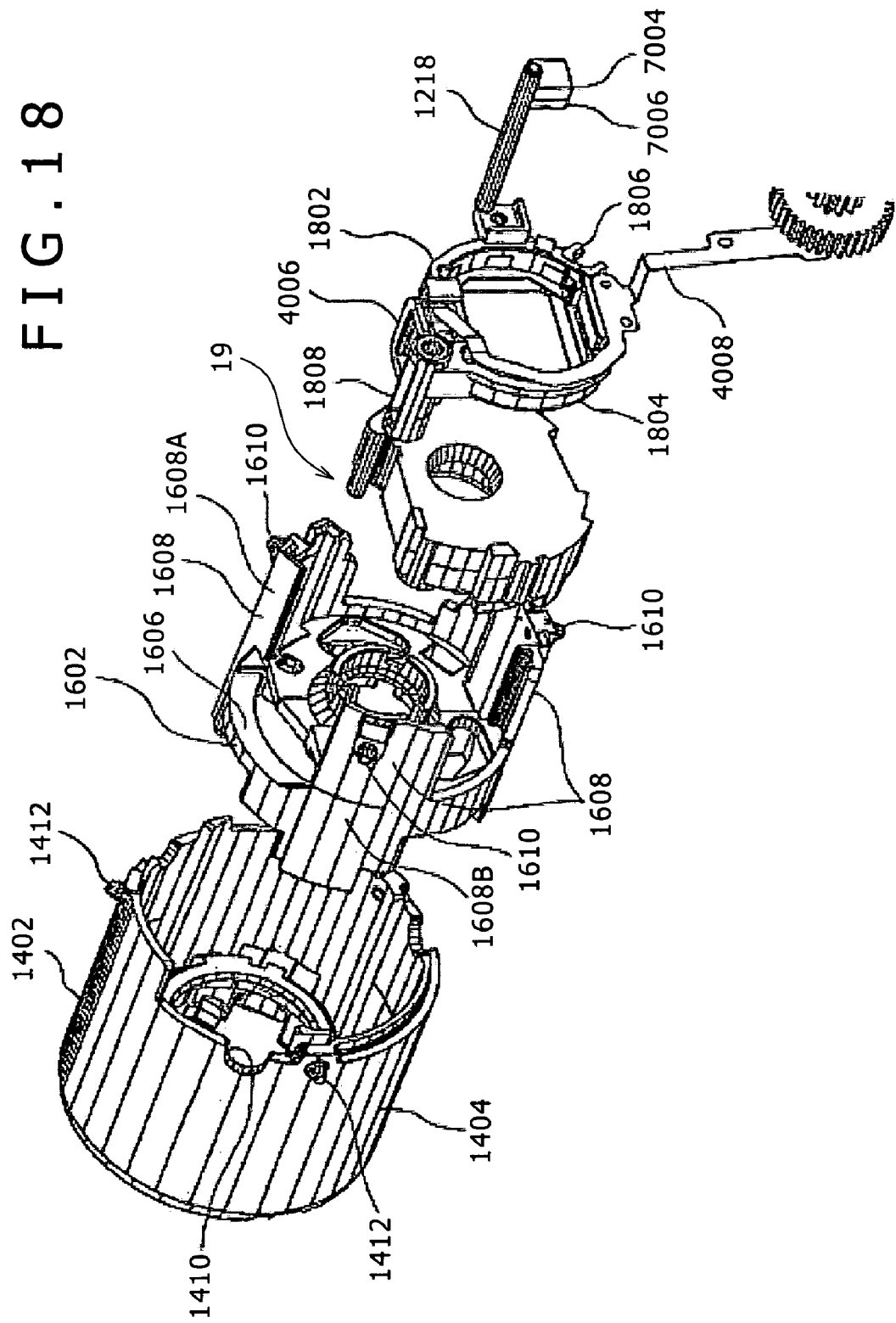
FIG. 18 is an exploded perspective view showing the first lens holding frame, the second lens holding frame, the automatic exposure device, and the third lens holding frame shown in FIG. 16.
Figure 19:
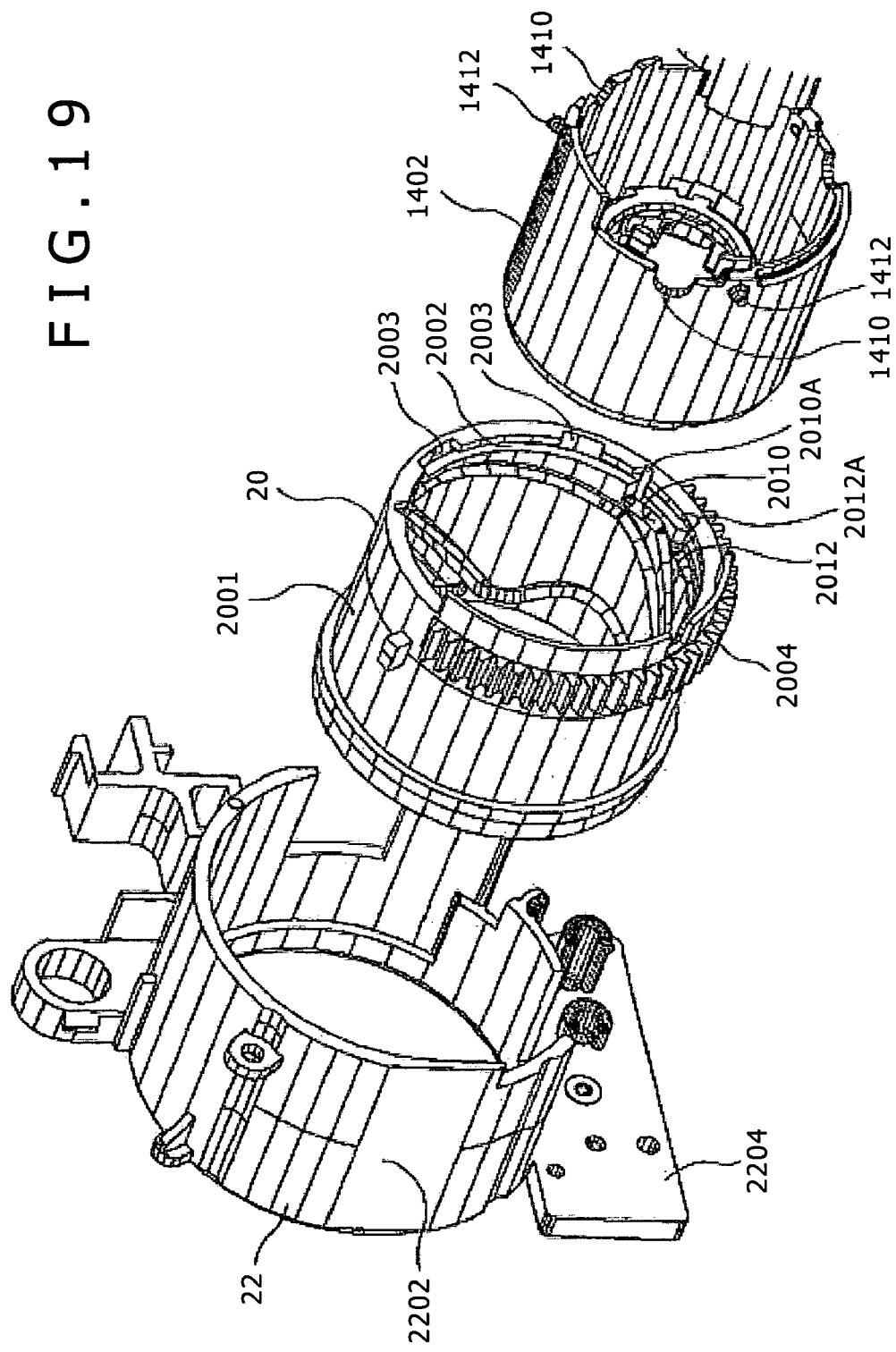
FIG. 19 is an exploded perspective view showing the fixed ring, the cam ring, and the first lens holding frame shown in FIG. 16.

FIG. 16 is an exploded perspective view, from the rear side, of the lens-barrel 10, FIG. 17 is an exploded perspective view showing the third lens holding frame, the base, and the flexible substrate shown in FIG. 16, FIG. 18 is an exploded perspective view showing the first lens holding frame, the second lens holding frame, the automatic exposure device, and the third lens holding frame shown in FIG. 16, and FIG. 19 is an exploded perspective view showing the fixed ring, the cam ring, and the first lens holding frame shown in FIG. 16.

Figure 20:
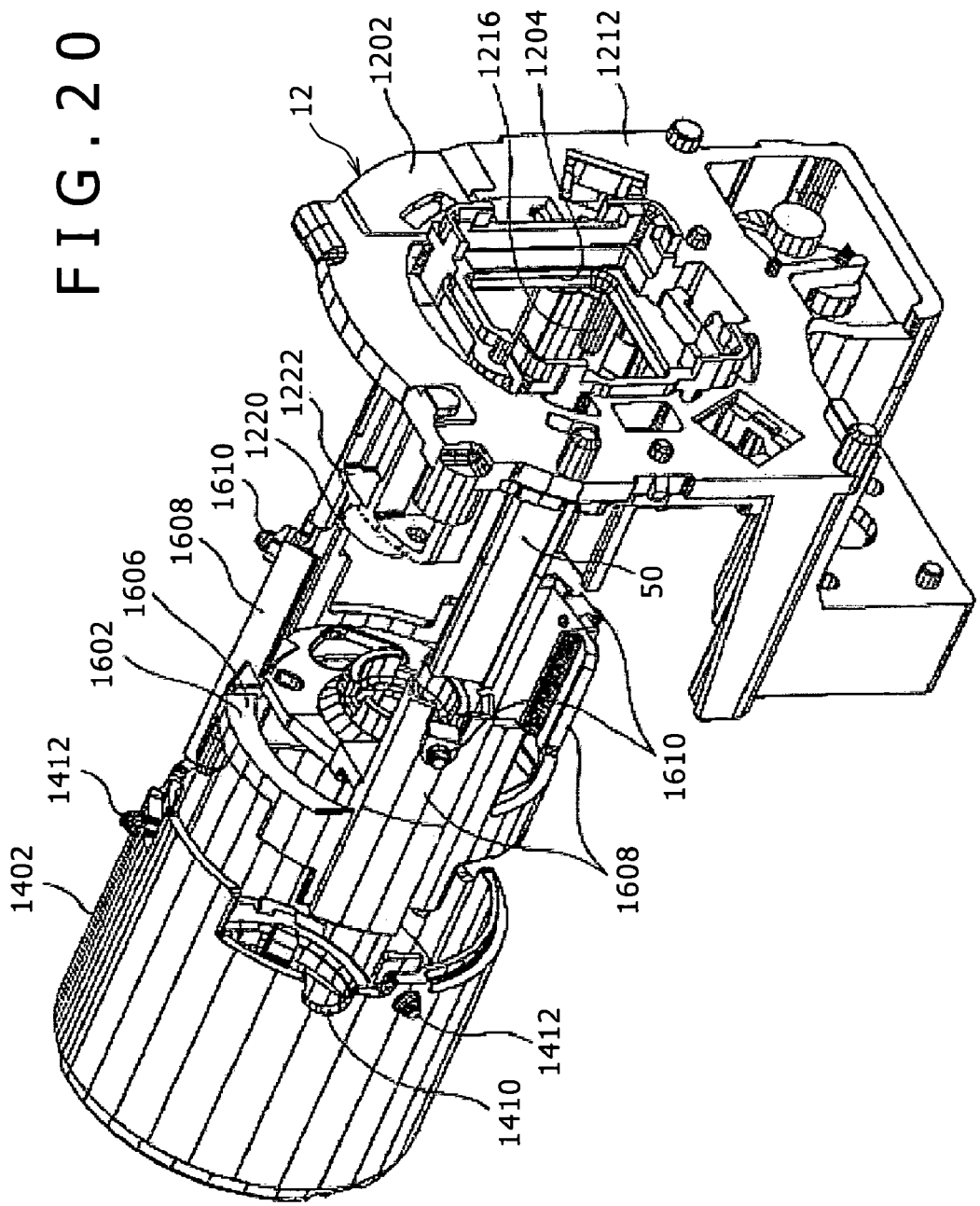
FIG. 20 is an exploded perspective view showing the first lens holding frame, the second lens holding frame, and the base.
Figure 21:
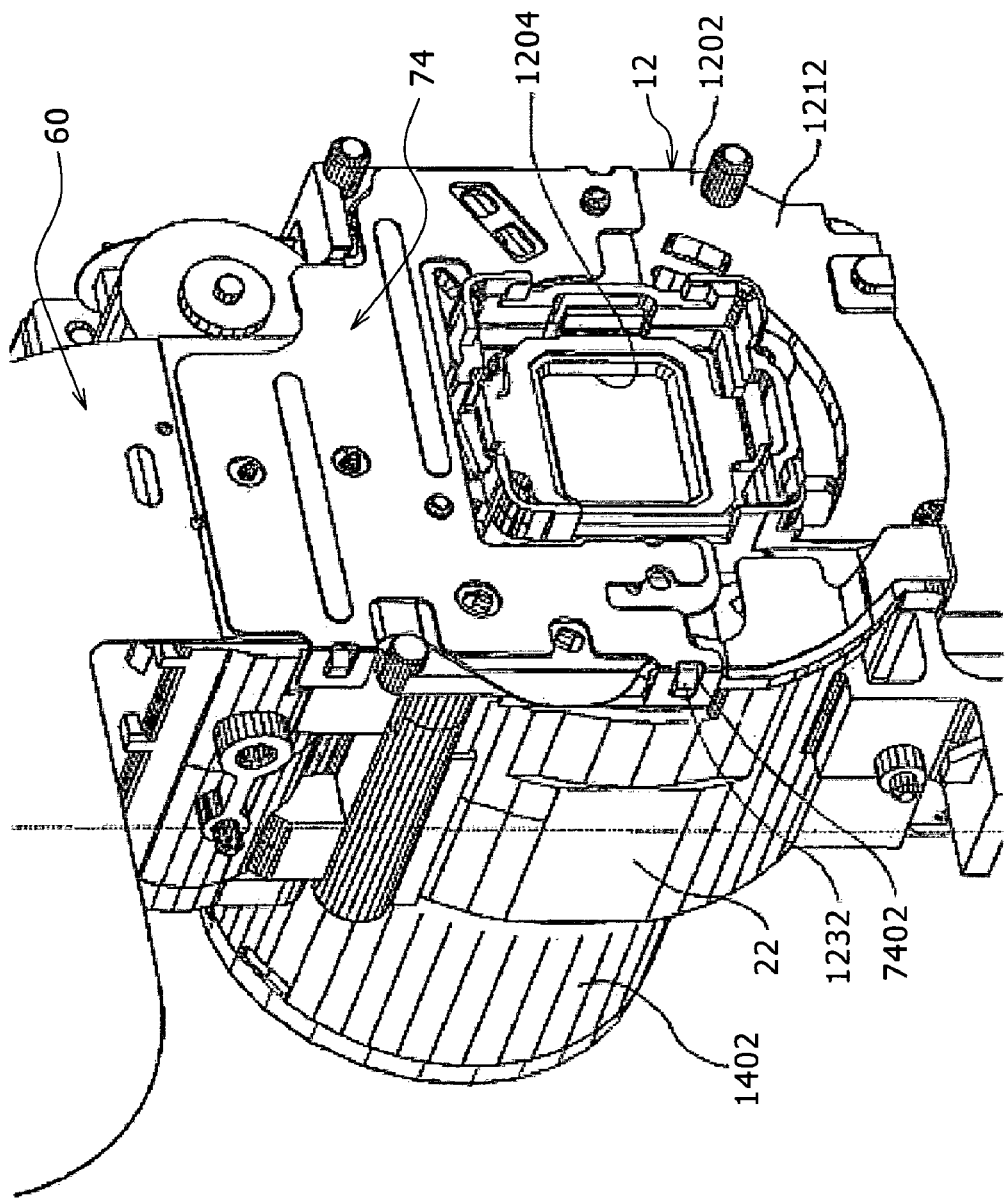
FIG. 21 is an assembly diagram of the fixed ring, the cam ring, the first lens holding frame, the second lens holding frame, the third lens holding frame, and the flexible substrate.

FIG. 20 is an exploded perspective view showing the first lens holding frame, the second lens holding frame, and the base, and FIG. 21 is an assembly diagram of the fixed ring, the cam ring, the first lens holding frame, the second lens holding frame, the third lens holding frame, and the flexible substrate.

Figure 22:
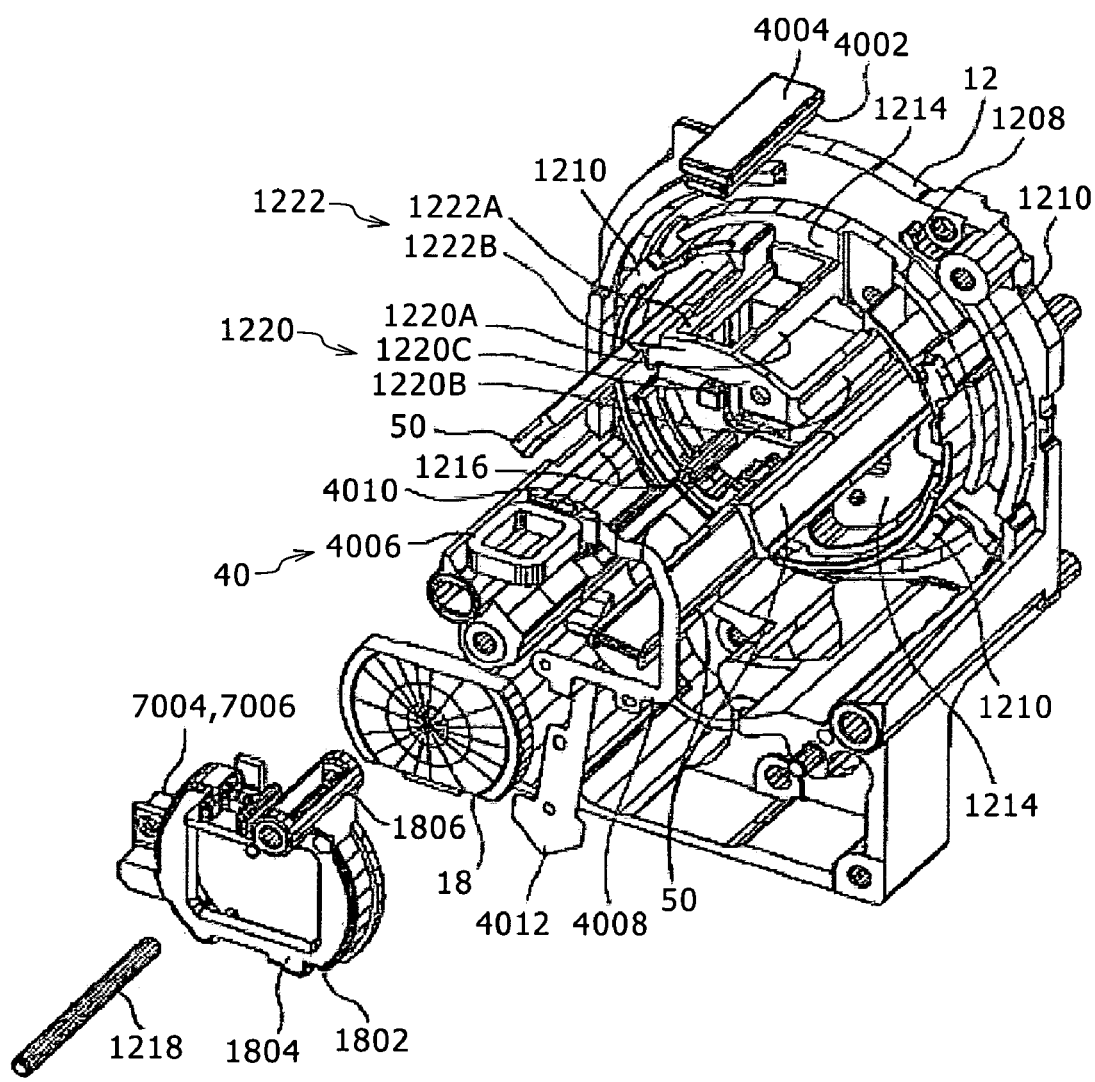
FIG. 22 is an exploded perspective view of the third lens holding frame, and the base.
Figure 23:
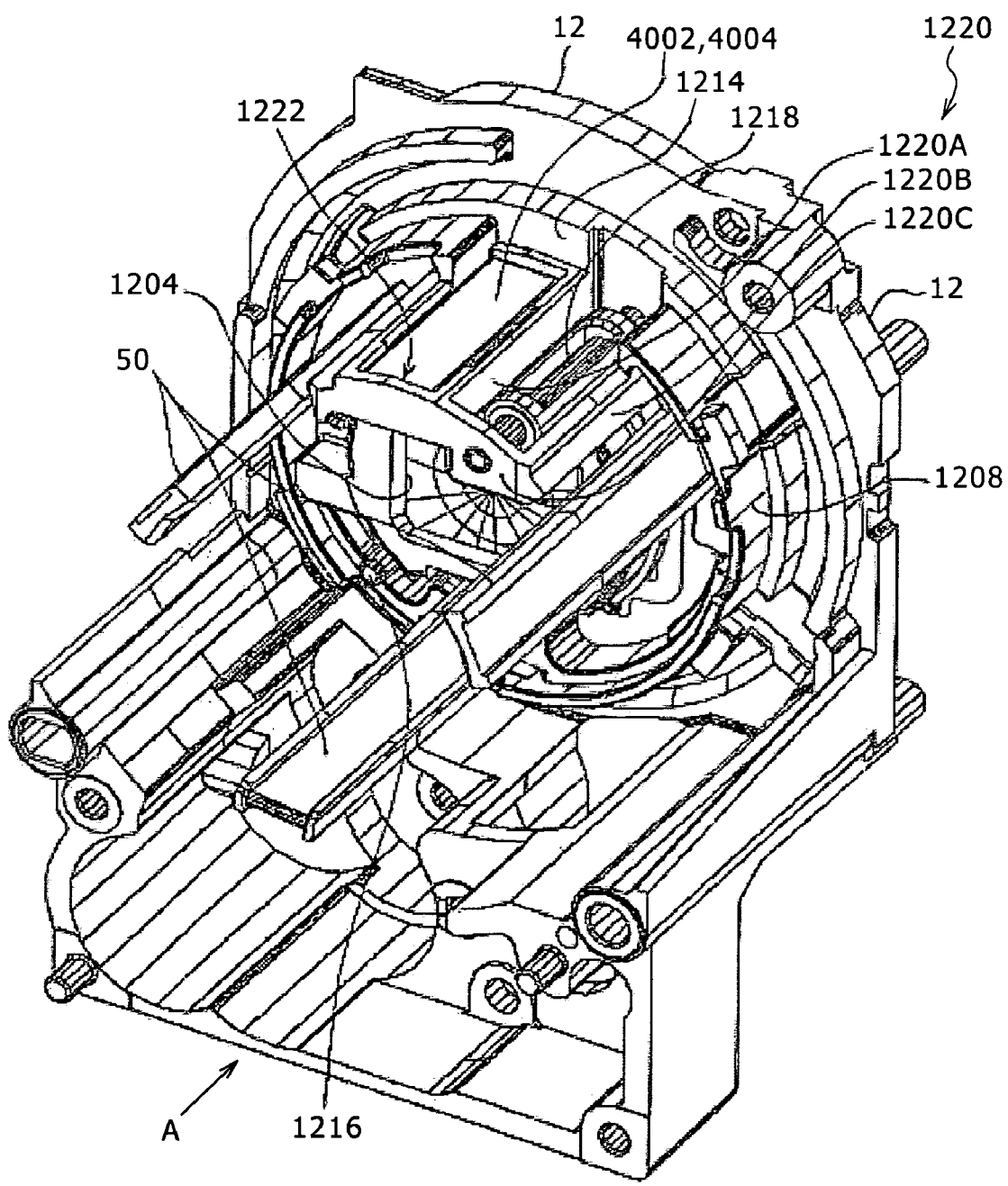
FIG. 23 is an assembly diagram of FIG. 22.
Figure 24:
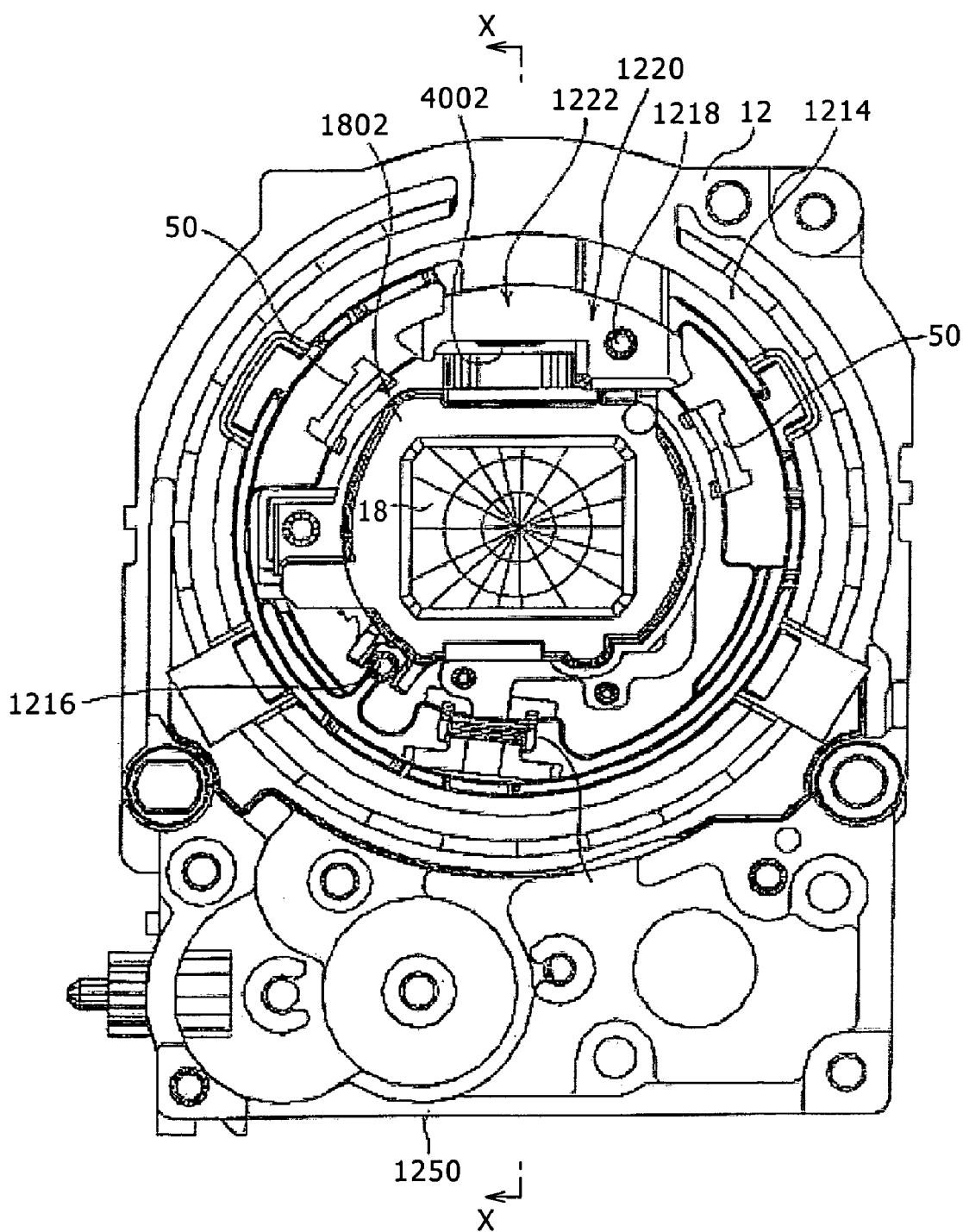
FIG. 24 is a view along arrow A of FIG. 23.
Figure 25:
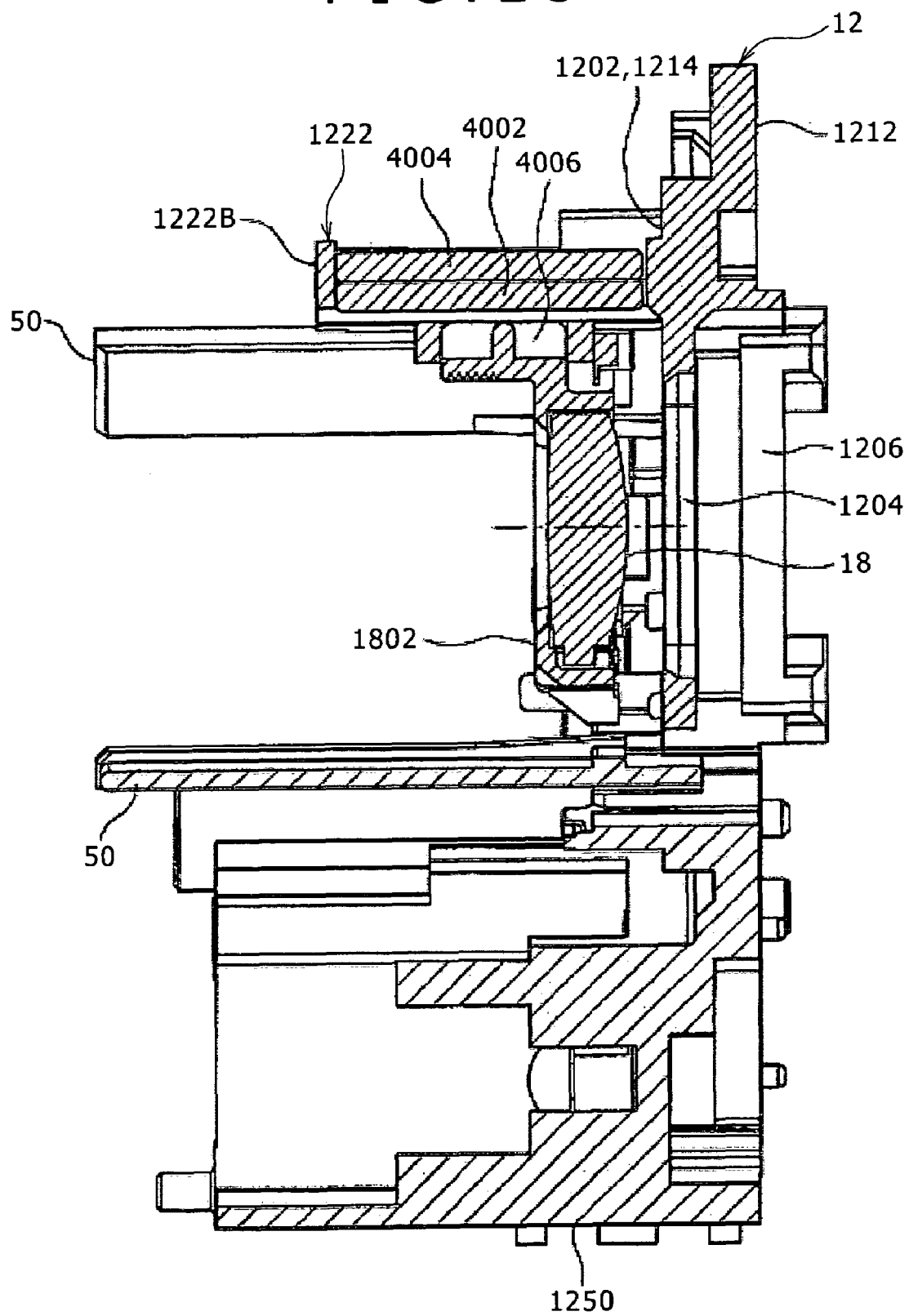
FIG. 25 is a sectional view along line X-X of FIG. 24.

FIG. 22 is an exploded perspective view of the third lens holding frame, and the base, FIG. 23 is an assembly diagram of FIG. 22, FIG. 24 is a view along arrow A of FIG. 23, and FIG. 25 is a sectional view along line X-X of FIG. 24.

Figure 26:
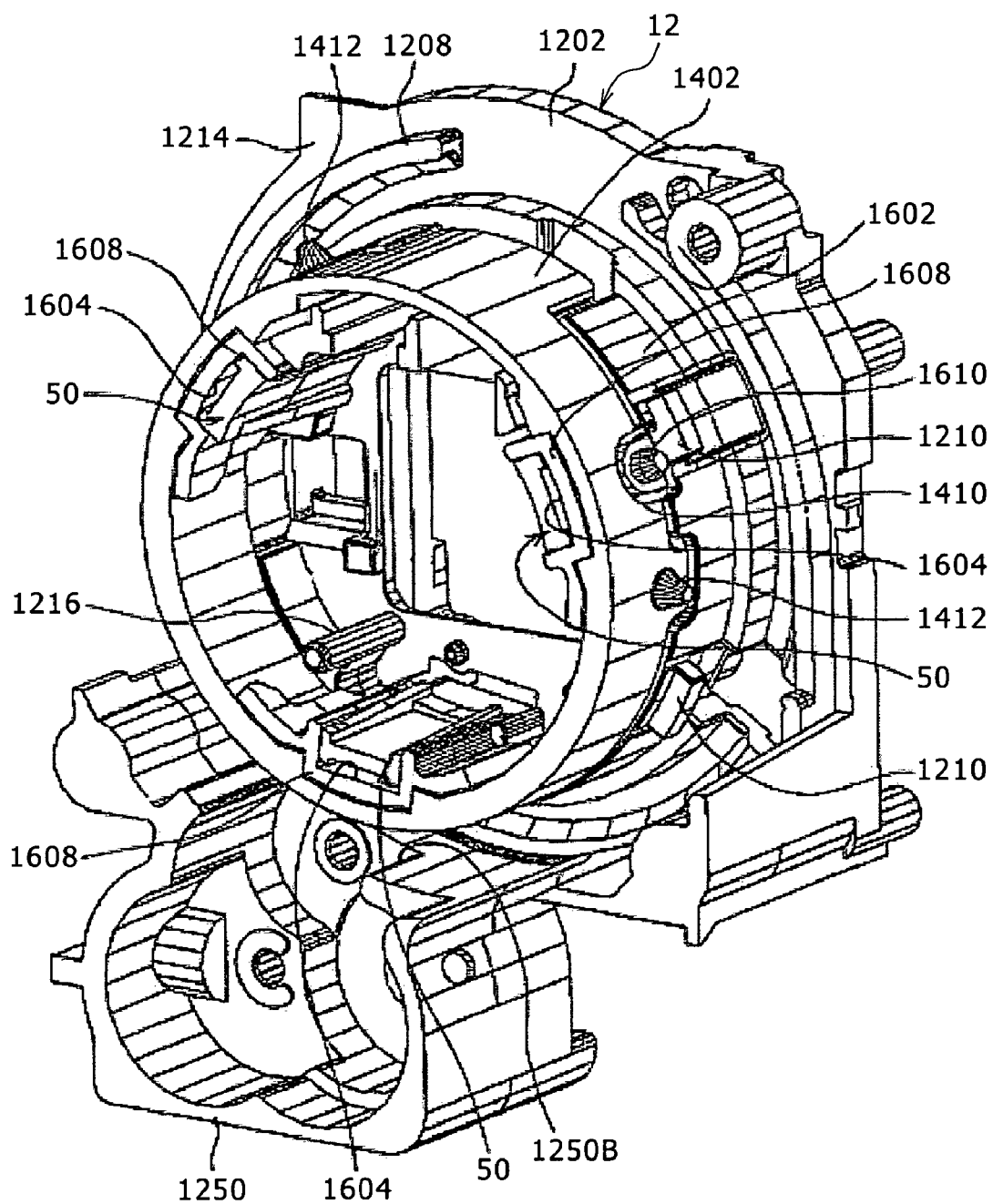
FIG. 26 is a perspective view showing the condition where the first lens holding frame, the second lens holding frame, and the base are assembled, and broken along a plane parallel to the optical axis.
Figure 27:
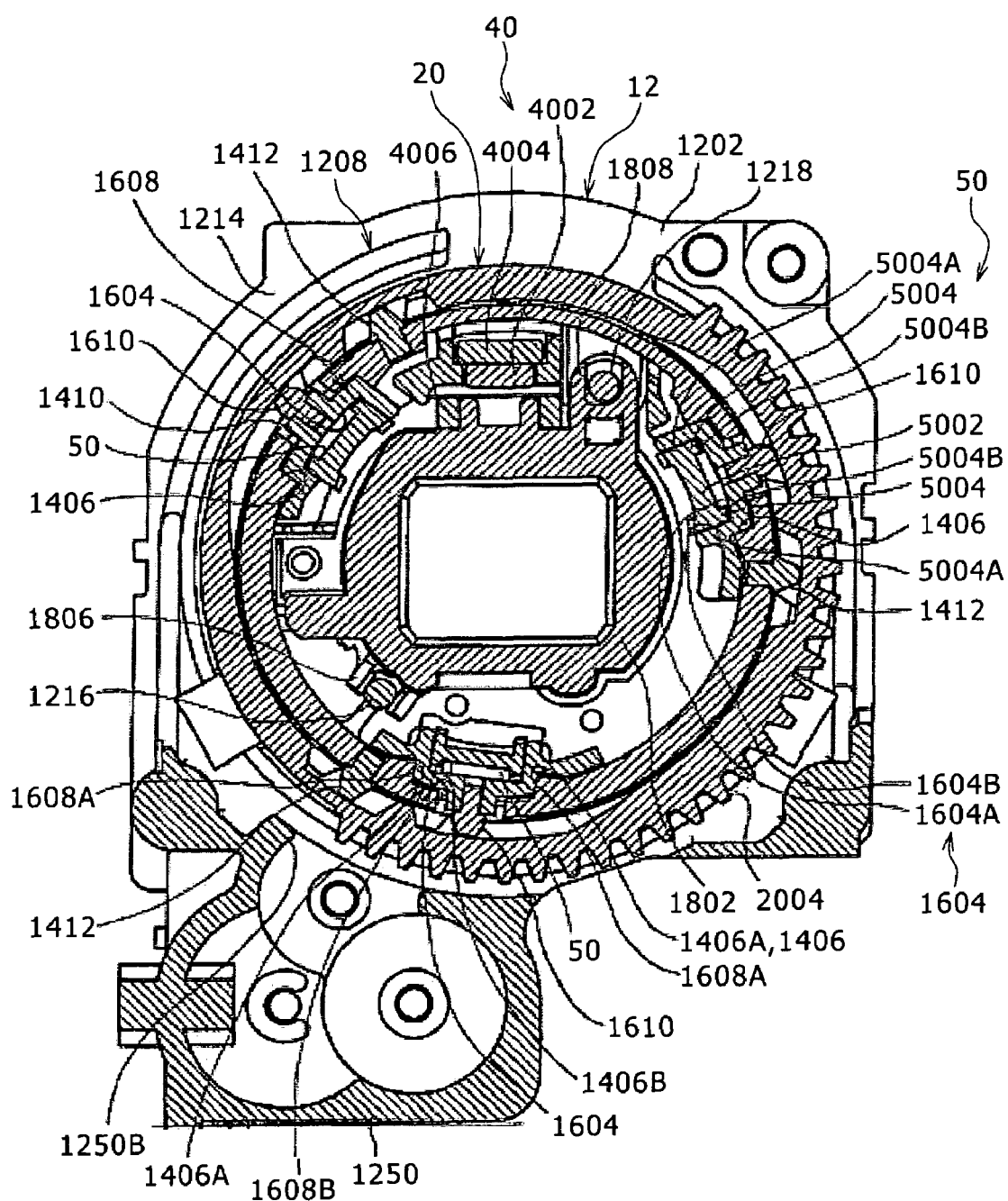
FIG. 27 is a sectional view of the lens-barrel, broken along a plane parallel to the optical axis.
Figure 28:
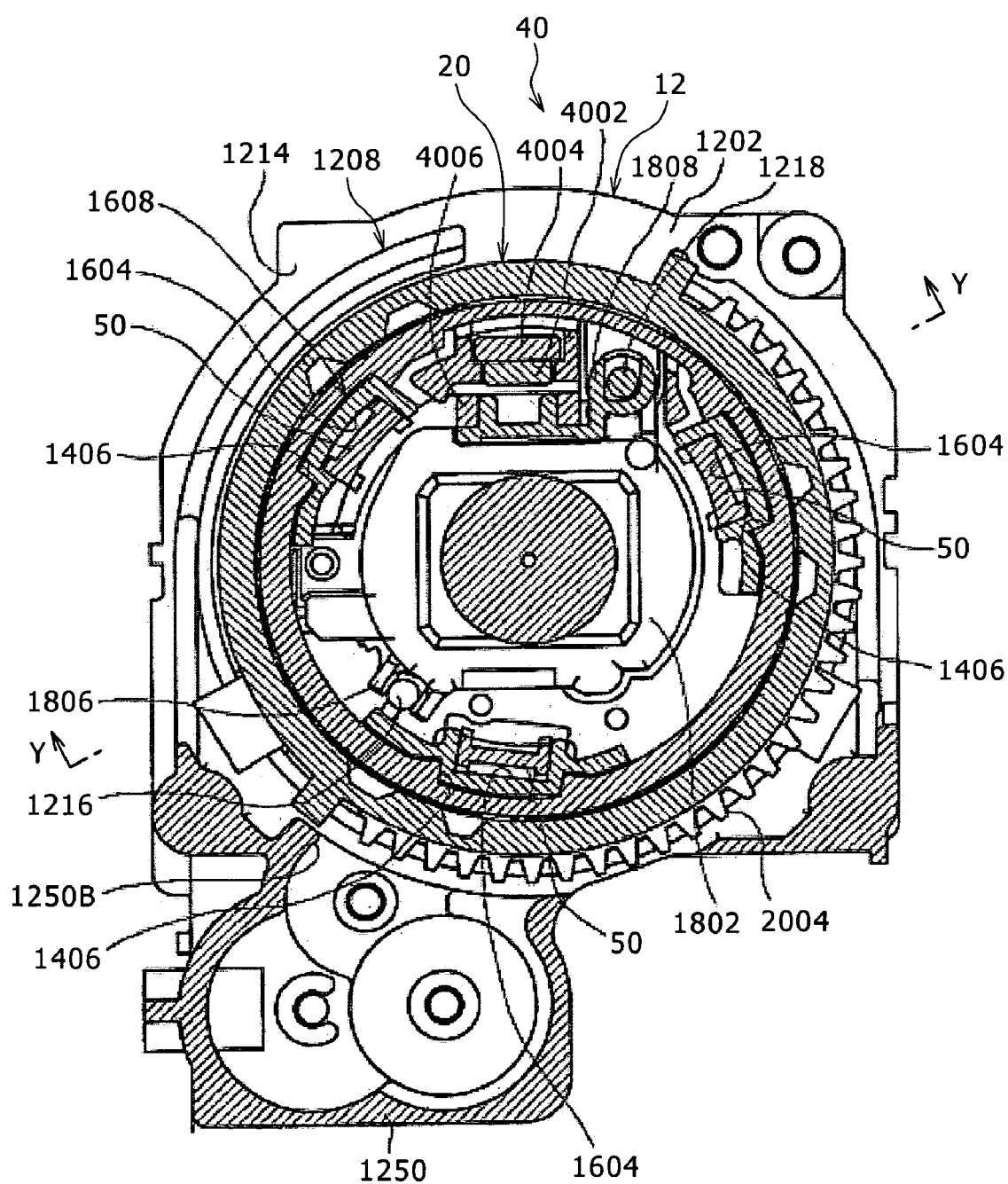
FIG. 28 is a sectional view of the lens-barrel, broken along a plane parallel to the optical axis.
Figure 29:
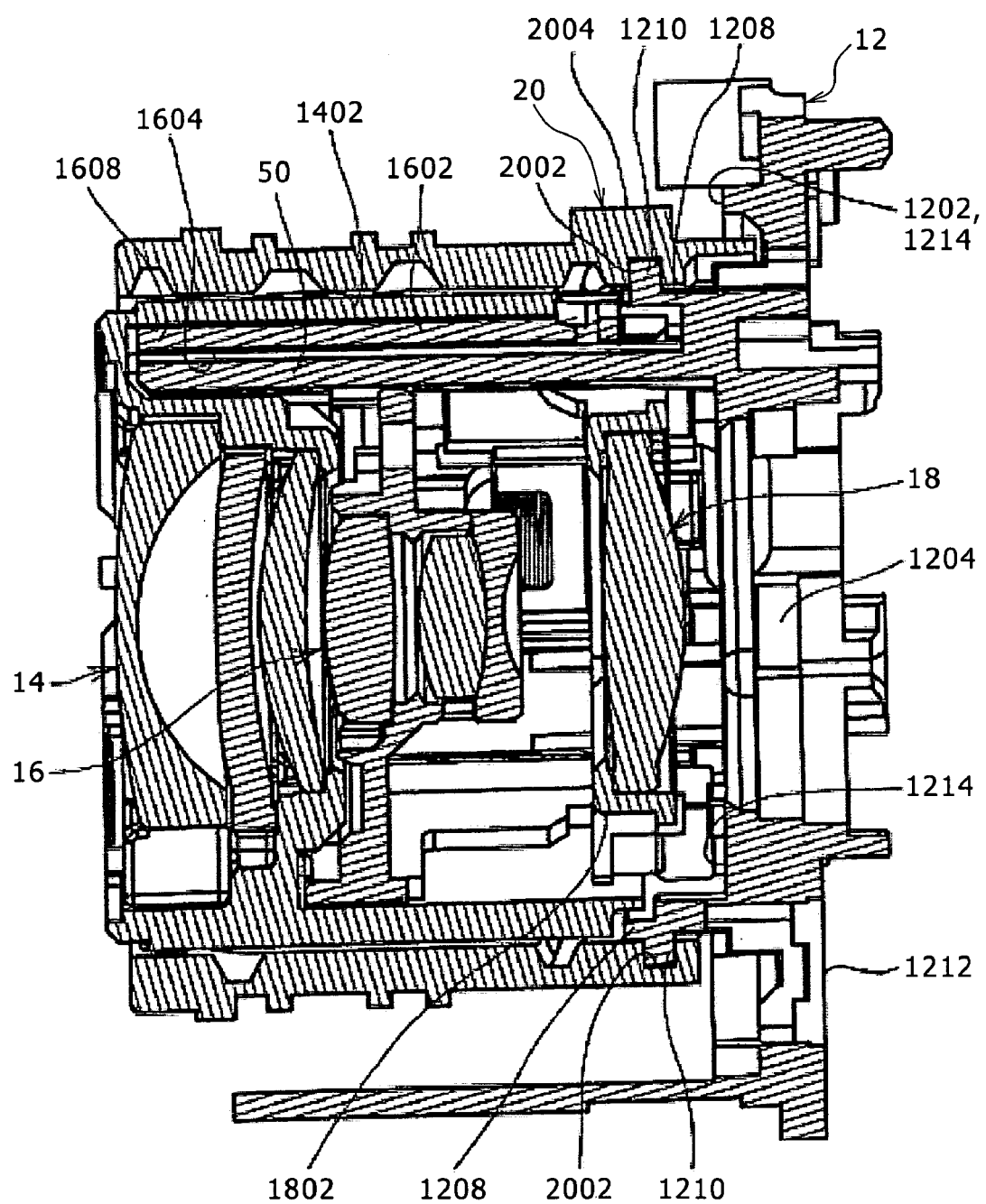
FIG. 29 is a sectional view along line Y-Y of FIG. 28.

FIG. 26 is a perspective view showing the condition where the first lens holding frame, the second lens holding frame, and the base are assembled, and broken along a plane parallel to the optical axis, FIG. 27 is a sectional view of the lens-barrel, broken along a plane parallel to the optical axis, FIG. 28 is a sectional view of the lens-barrel, broken along a plane parallel to the optical axis, and FIG. 29 is a sectional view along line Y-Y of FIG. 28.

Incidentally, in the drawings in the present specification, while area in which a plurality of straight lines are drawn are present in the surfaces of lenses, the surfaces of members, and the surfaces of component parts, these areas are represented on a drawing basis, and the portions where the plurality of straight lines are drawn are each actually a cylindrical surface or a curved surface or a spherical surface.

As shown in FIGS. 5 to 7, the image pickup optical system 104 contained in the lens-barrel 10 is composed of three groups on an optical basis. Specifically, let the object side in the optical axis direction of the lens-barrel 10 (the image pickup optical system 104) be the front side and let the image pickup device 116 side in the optical axis direction be the rear side, the three groups constituting the image pickup optical system is composed of first group lenses 14, second group lenses 16, and third group lenses 18, arranged in this order from the front side toward the rear side.

The lens-barrel 10 is so configured that zooming is performed when the first group lenses 14 and the second group lenses 16 are driven in the optical axis direction according to a predetermined cam curve and that focusing is performed when the third group lenses 18 are minutely displaced in the optical axis direction. Specifically, the focal distance is variable by displacements of the first group lenses 14 and the second group lenses 16, and deviations of the focusing position arising from changes in the focal distance are corrected by the displacement of the third group lenses, to obtain appropriate focusing.

As shown in FIGS. 8 and 16, the lens-barrel 10 includes a base 12 fixed to the case 102, a third lens holding frame 1802 for holding the third group lenses 18, an electrical equipment part 19, a second lens holding frame 1602 for holding the second group lenses 16, a first lens holding frame 1402 for holding the first group lenses 14, a cam ring 20, and a fixed ring 22.

As shown in FIGS. 9, 17 and 25, the base 12 includes a plate-like base main body 1202, and a gear containing portion 1250 connected to the base main body 1202, and the base 12 in this example is formed of a synthetic resin.

The base main body 1202 is provided with an opening 1204 penetrating through the center thereof, and a rear surface 1212 where the base main body 1202 fronts on the rear side is provided with a recessed portion 1206 surrounding the periphery of the opening 1204. The image pickup device 140 is mounted to the recessed portion 1206 by adhesion or the like so that an image pickup surface fronts on the opening 1204.

As shown in FIGS. 12 and 29, on a front surface 1214 where the base main body 1202 fronts on the front side, a cylindrical wall 1208 is erected along a cylindrical shape with the optical axis of the image pickup optical system 104 as a center.

On the outer periphery of the cylindrical wall 1208, four engaging pieces 1210 are projected radially outwards at intervals on the circumferential direction, and the engaging pieces 1210 are engaged with an engaging groove 2002 formed along the circumferential direction of the inner periphery of the cam ring 20, whereby the cam ring 20 is supported on the base 12 in the state of being rotatable in the circumferential direction of the cam ring 20 and non-movable along the axial direction of the cam ring 20. Incidentally, as shown in FIG. 19, the cam ring 20 is provided with an opened groove 2003 opened at an end portion of the cam ring 20 and connected to the engaging groove 2002, and the engagement of the engaging pieces 1210 with the engaging groove 2002 is performed by inserting the engaging pieces 1210 into the engaging groove 2002 through the opened groove 2003.

As shown in FIG. 23, at an inside portion of the cylindrical wall 1208 on the front surface 1214 of the base main body 1202, two guide shafts 1216 and 1218 for guiding the third lens holding frame 1802 in the optical axis direction are provided on opposite sides of the opening 1204, and the guide shafts 1216 and 1218 extend in parallel to the optical axis of the image pickup optical system 104.

The guide shaft 1216 on one side has a rear end fixed to the front surface 1214.

The guide shaft 1218 on the other side has a rear end fixed to the front surface 1214, and has a front end supported by a support portion 1220.

The support portion 1220 is composed of first and second support walls 1220A and 1220B erected on the front surface 1214, and a first connection wall 1220C for connection between the front ends of the support walls 1220A and 1220B, and the front end of the guide shaft 1218 is fixed to the first connection wall 1220C.

As shown in FIGS. 22, 23, 24 and 25, on the front surface 1214 of the base main body 1202, a magnet mount portion 1222 is provided adjacently to the support portion 1220.

As shown in FIG. 22, the magnet mount portion 1222 is formed in a rectangular frame-like shape having its longitudinal direction conforming to the above-mentioned optical axis, while including the first support wall 1220A, a third support wall 1222A erected on the front surface 1214 with a spacing from the first support wall 1220A in the opposite direction of the second support wall 1220B and in the direction around the optical axis, a second connection wall 1222B connected to the first connection wall 1220B and serving for connection between the tip ends of the first support wall 1220A and the third support wall 1222A, and a portion of the front surface 1214 between the first and third support walls 1220A and 1222A.

A belt plate-like drive magnet 4002 and a belt plate-like back yoke 4004 a little larger in profile than the drive magnet 4002 and mounted to one surface in the thickness direction of the drive magnet 4002 are inserted into and mounted to the inside of the magnet mount portion, with their extending direction conforming to the optical axis direction.

The drive magnet 4002 has first regions magnetized in one of N pole and S pole and second regions magnetized in the other of N pole and S pole, the first and second regions arranged alternately along the longitudinal direction of the drive magnet 4002. The drive magnet 4002 is so arranged that the drive magnet 4002 fronts on the optical axis and that the first and second regions of the drive magnet 4002 are parallel to the tangents to a circle circumference with the optical axis as a center.

As shown in FIG. 9, on the front surface 1214 of the base main body 1202, three guide posts 50 are projected in parallel to the optical axis and at regular intervals in the circumferential direction of the cylindrical wall 1208 (at regular intervals in the circumferential direction of the second lens holding frame 1602 which will be described later); in other words, the three guide posts 50 are projected at regular intervals in the circumferential direction of the cam ring 20 which will be described later, and front on the inner peripheral surface 1620 (see FIG. 33) of the second lens holding frame 1602 which will be described later.

In this example, the guide posts 50 are molded from a synthetic resin integrally with the base 12.

As shown in FIG. 27, the guide posts 50 has a section in an I shape composed of a web 5002 and flanges 5004 at both ends of the web 5002.

The guide posts 50 are each so arranged that the extension direction of the web 5002 constituting the section thereof is parallel to a tangent to a cylindrical wall 1208 portion located on the radially outer side of the guide post 50. In other words, the guide posts 50 are each so arranged as to be parallel to a tangent to the portion of the second lens holding frame 1602 which will be described later.

As shown in FIG. 8, the gear containing portion 1250 has an opening 1250A opened to the front side and an opening 1250B opened to a lateral side fronting on the optical axis side, and contains therein a speed reduction mechanism 1252 composed of a gear train. The speed reduction mechanism 1252 is for reducing the speed of a rotational drive force, when a drive shaft of a motor 1254 constituting the above-mentioned drive unit 146 is rotated, and for transmitting the speed-reduced rotational drive force to the cam ring 20 to thereby rotate the cam ring 20.

The motor 1254 is mounted to the gear containing portion 1250, a gear at an upstream end constituting the speed reduction mechanism 1252 is meshed with the drive gear 1256 of the motor 1254, and a gear at a downstream end constituting the speed reduction mechanism 1252 is meshed with a gear portion 2004 provided at the outer periphery of the cam ring 20 through the opening 1250B.

As shown in FIG. 9, the main flexible substrate 60 is mounted to the rear surface 1212 of the base 12.

A Hall element 7002 for detecting the position of the third lens holding frame 1802 and the like are mounted on the main flexible substrate 60, and the main flexible substrate 60 is provided with a connection portion which is electrically connected to a terminal portion of the motor 1254.

A detection signal from the Hall element 7002 is supplied through the main flexible substrate 60 to the control unit 148, and a drive signal from the control unit 148 is supplied through the main flexible substrate 60 to the motor 1254.

As shown in FIG. 17, the Hall element 7002 is contained in a mount recessed portion 1240 provided in the rear surface 1212 of the base 12.

The image pickup device 140 is mounted on a flexible substrate (not shown), and an image pickup signal from the image pickup device 140 is supplied through the flexible substrate (not shown) to the image processing unit 142.

As shown in FIGS. 22 and 27, the third lens holding frame 1802 has a frame main body 1804 for holding the third group lenses 18.

The frame main body 1804 is provided with bearings 1806 and 1808 at two positions on opposite sides of the optical axis, and the above-mentioned guide shafts 1216 and 1618 are passed through the bearings 1806 and 1808, whereby the third lens holding frame 1802 is so supported as to be movable in the optical axis direction and non-rotatable around the optical axis.

A coil 4006 (corresponding to the electrical equipment part in the claims) wound around an axis orthogonal to a surface where the magnet 4002 fronts on the third lens holding frame 1802 (around an axis orthogonal to the optical axis) is fixed to a portion where the frame main body 1804 fronts on the magnet 4002, by use of an adhesive or the like. The coil 4006 is electrically connected to the main flexible substrate 60 through a coil flexible substrate 4008 (corresponding to the electrical equipment part flexible substrate in the claims), and the drive signal from the control unit 148 is supplied to the coil 4006 through the main and coil flexible substrates 60 and 4008. Specifically, as shown in FIG. 22, a tip end portion 4010 of the coil flexible substrate 4008 is connected to the coil 4006, and a base end portion 4012 of the coil flexible substrate 4008 is connected to the main flexible substrate 60.

In this example, the magnet 4002, the back yoke 4004 and the coil 4006 constitute a linear motor 40, and a magnetic interaction between a magnetic field generated from the coil 4006 by he supply of a drive current from the control unit 148 to the coil 4006 and magnetic fields of the first and second regions of the magnet 4002 generates a drive force for moving the third lens holding frame 1802 forwards or rearwards in the optical axis direction.

As shown in FIGS. 9 and 22, a magnet 7004 is mounted to a portion where the frame main body 1804 fronts on the Hall element 7002, through the back yoke 7006 by adhesion or the like.

In this example, the intensity of magnetic force (magnetic flux density) of the magnet 7004 is detected by the Hall element 7002, and a detection signal generated by the Hall element 7002 is supplied to the control unit 148, whereby the position in the optical axis direction of the third lens holding frame 1802 is detected by the control unit 148; the Hall element 7002, the magnet 7004 and the control unit 148 constitute a position detecting mechanism 70.

As shown in FIGS. 10 and 18, the second lens holding frame 1602 includes a ring plate part 1606 for holding the second group lenses 16, and guide portions 1608 extending in the axial direction from three positions, at regular intervals in the circumferential direction, of an outer peripheral portion of the ring plate portion 1606.

Guide grooves 1604 are formed at portions (inner peripheral portions of the second lens holding frame 1602) where the guide portions 1608 front on the radially inner side of the ring plate portion 1606.

As shown in FIG. 27, the guide groove 1604 is formed to be opened to the radially inner side of the second lens holding frame 1602 while being composed of opposed side surfaces 1604A and a bottom surface 1604B for connection between depth portions of the lateral surfaces 1604A, and the guide groove 1604 extends in parallel to the optical axis.

The guide posts 50 are engaged with the guide grooves 1604, whereby the second lens holding frame 1602 is supported by the three guide posts 50 so as to be non-rotatable and be movable in the axial direction (the optical axis direction).

To be more specific, outside surfaces 5004A of both end flanges 5004 constituting the guide post 50 are engaged with the lateral surfaces 1604A of the guide groove 1604 of the second lens holding frame 1602, whereby the second lens holding frame 1602 is prevented from moving in the circumferential direction; in addition, end faces 5004B of both end flanges 5004 are engaged with the bottom surface 1604B of the guide groove 1604, whereby the second lens holding frame 1602 is inhibited from moving in the radial direction.

Besides, side surfaces 1608A are formed on both sides of the direction orthogonal to the extension direction of the guide portion 1608, and an outside surface 1608B is formed at a surface where the guide portion 1608 fronts on the radially outer side.

At a portion, fonting on the radially outer side of the guide groove 1604 and near the rear side, of the second lens holding frame 1602 (a portion of the guide portion 1608), a second cam pin 1610 is projected radially outwards.

As shown in FIG. 18, the second cam pin 1610 of each guide portion 1608 penetrates through a cutout 1410 formed in an outer peripheral portion of the first lens holding frame 1402 which will be described later, projects from the outer peripheral portion of the first lens holding frame 1402, and is engaged with a second cam groove 2012 of the cam ring 20, and the second lens holding frame 1602 is moved in the optical axis direction while the second cam pin 1610 is guided by the second cam groove 2012 in response to the rotation of the cam ring 20.

As shown in FIGS. 10, 18, and 31 to 33, the electrical equipment part 19 is provided at a rear portion of the second lens holding frame 1602 so as to be moved in the optical axis direction as one body with the second lens holding frame 1602.

Figure 32:
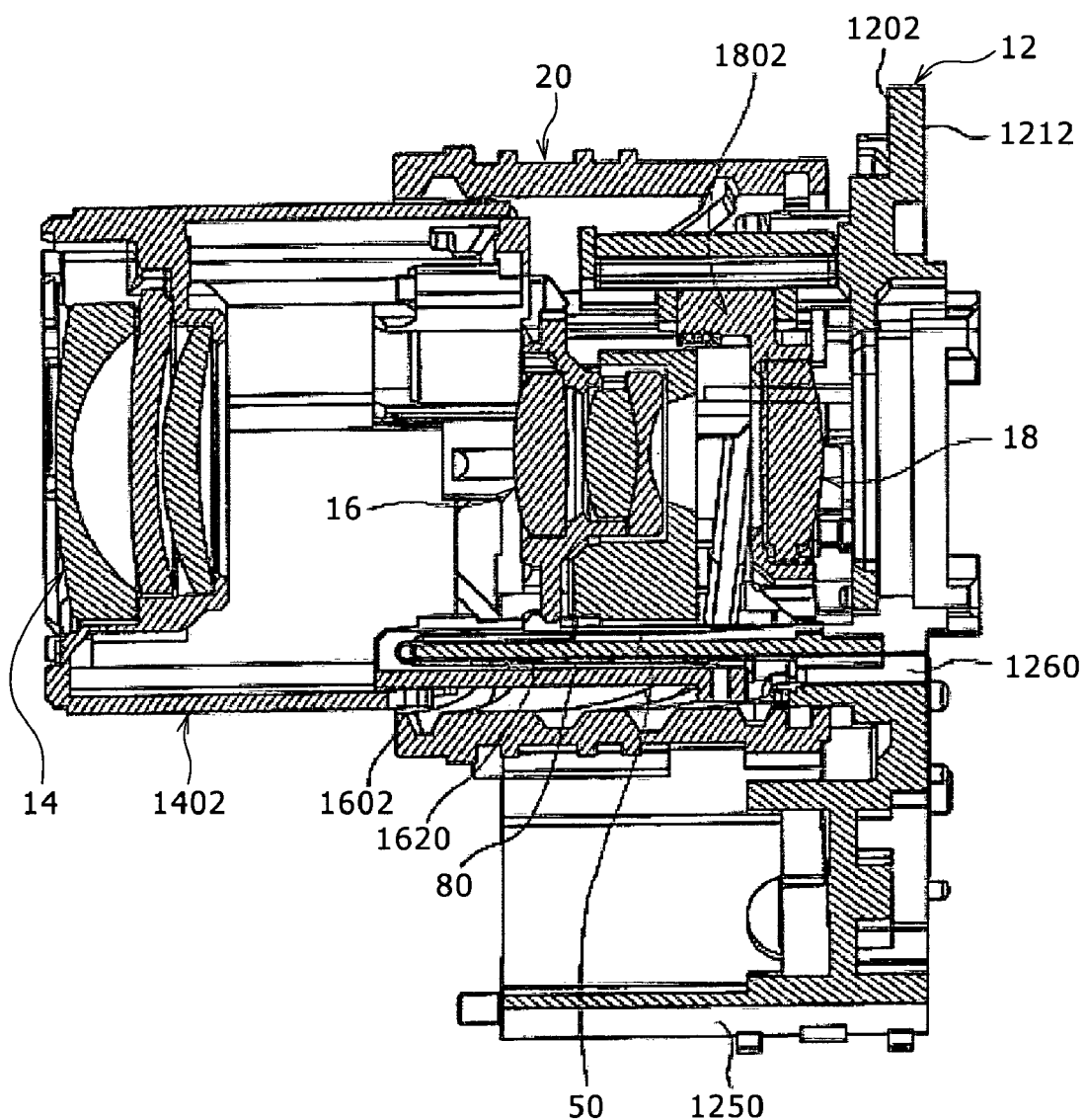
FIG. 32 is a sectional view of the lens-barrel showing the condition of the shutter flexible substrate 80 in the wide angle condition.

The electrical equipment part 19 has the function of a shutter and the function of a variable diaphragm, and is electrically connected to the main flexible substrate 60 through the shutter flexible substrate 80 (corresponding to the electrical equipment part flexible substrate in the claims; see FIG. 32). A drive signal is supplied (transferred) from the control unit 148 to the electrical equipment part 19 through the main flexible substrate 60 and the shutter flexible substrate 80, whereby the shutter action and the variable diaphragm action are controlled.

As shown in FIGS. 10 and 18, the first lens holding frame 1402 has a tubular body 1404 for holding the first group lenses 14, and, at a portion where the tubular body 1404 fronts on the radially inner side (at an inner peripheral portion of the first lens holding frame 1402), a guide groove 1406 for engagement with the guide portion 1608 of the second lens holding frame 1602 is formed to extend along the axial direction.

As shown in FIG. 27, the guide groove 1406 is formed in a shape opened to the radially inner side of the first lens holding frame 1402, and is composed of opposed side surfaces 1406A and a bottom surface 1406B for connection between depth portions of the side surfaces 1406A.

The guide portions 1608 are engaged respectively with the guide grooves 1406 of the first lens holding frame 1402, whereby the first lens holding frame 1402 is supported by the three guide portions 1608 so as to be non-rotatable and be movable in the axial direction.

To be more specific, both side surfaces 1680A of each guide portion 1608 are engaged with both side surfaces 1406A of each guide groove 1406, whereby the first lens holding frame 1402 is inhibited from moving in the circumferential direction, and the outside surface 1608B of each guide portion 1608 is engaged with the bottom surface 1406B of each guide groove 1406, whereby the first lens holding frame 1402 is inhibited from moving in the radial direction.

At a portion where the tubular body 1404 fronts on the radially outer side (at an outer peripheral portion of the first lens holding frame 1402), three first cam pins 1412 are projected radially outwards at regular intervals in the circumferential direction.

As shown in FIG. 19, each first cam pin 1412 is engaged with a first cam groove 2010 in the cam ring 20, and, in response to the rotation of the cam ring 20, the first lens holding frame 1402 is moved in the optical axis direction while the first cam pins 1412 are guided by the first cam groove 2010.

Besides, in the barrel retracted condition of the lens-barrel 10 shown in FIG. 4A, the second cam pins 1610 of the second lens holding frame 1602 are each located in the cutout 1410 in the first lens holding frame 1402 as shown in FIG. 13, and the first cam pins 1412 of the first lens holding frame 1402 and the second cam pins 1610 of the second lens holding frame 1602 are located substantially at the same positions in the optical axis direction and at regular intervals in the circumferential direction.

As shown in FIGS. 11 and 19, the cam ring 20 has a tubular body 2001, and the tubular body 2001 is provided with the above-mentioned gear portion 2004 at a portion near the rear side of an outer peripheral surface thereof.

The tubular body 2001 is provided in its inner peripheral surface with the above-mentioned first and second cam grooves 2010 and 2012 along the circumferential direction, and is provided at the rear end of its inner peripheral surface with first and second open grooves 2010A and 2012A connected to the first and second cam grooves 2010 and 2012.

Incidentally, the engagement of the first cam pins 1412 of the first lens holding frame 1402 with the first cam groove 2010 is performed by the insertion of the first cam pins 1412 into the first cam groove 2010 through the first open groove 2010A.

In addition, the engagement of the second cam pins 1610 of the second lens holding frame 1602 with the second cam groove 2012 is performed by the insertion of the second cam pins 1610 into the second cam groove 2012 through the second open groove 2012A.

As shown in FIGS. 11 and 19, the fixed ring 22 has a tubular body 2202 and a lid portion 2204 mounted to a portion near the front side of the tubular body 2202.

The tubular body 2202 has an inside diameter larger than the outside diameter of the cylindrical wall 1208 of the base 12, and is provided with an opening 2203 communicated with the containing space of the gear containing portion 1250.

A gear at the downstream end of the gear train in the gear containing portion 1250 is meshed with the gear portion 2004 of the cam ring 20 through the opening 2203.

As for the fixed ring 22, a rear end portion of the tubular body 2202 is mounted to the front surface 1214 of the base 12 by screws or the like in the condition where the first lens holding frame 1402, the second lens holding frame 1602, the third lens holding frame 1802 and the cam ring 20 are contained inside the tubular body 2202 and where the opening 1250A of the gear containing portion 1250 is closed with the lid portion 2204.

Now, the laying-around of the shutter flexible substrate 80 will be described below.

First, the shutter flexible substrate 80 will be described.

FIGS. 30A and 30B are perspective views of the shutter flexible substrate 80.

Figure 31:
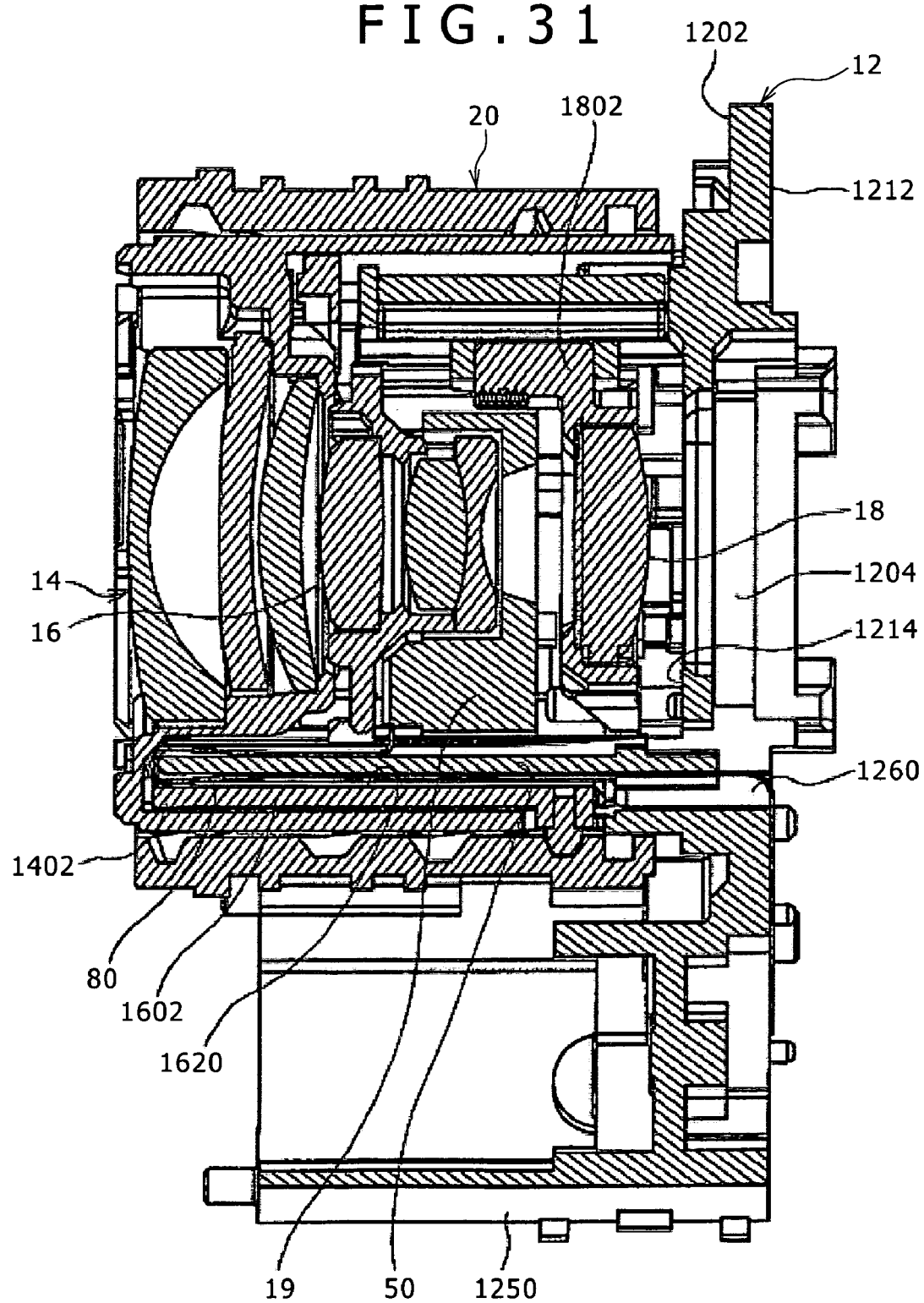
FIG. 31 is a sectional view of the lens-barrel showing the condition of the shutter flexible substrate 80 in the barrel retracted condition.
Figure 33:
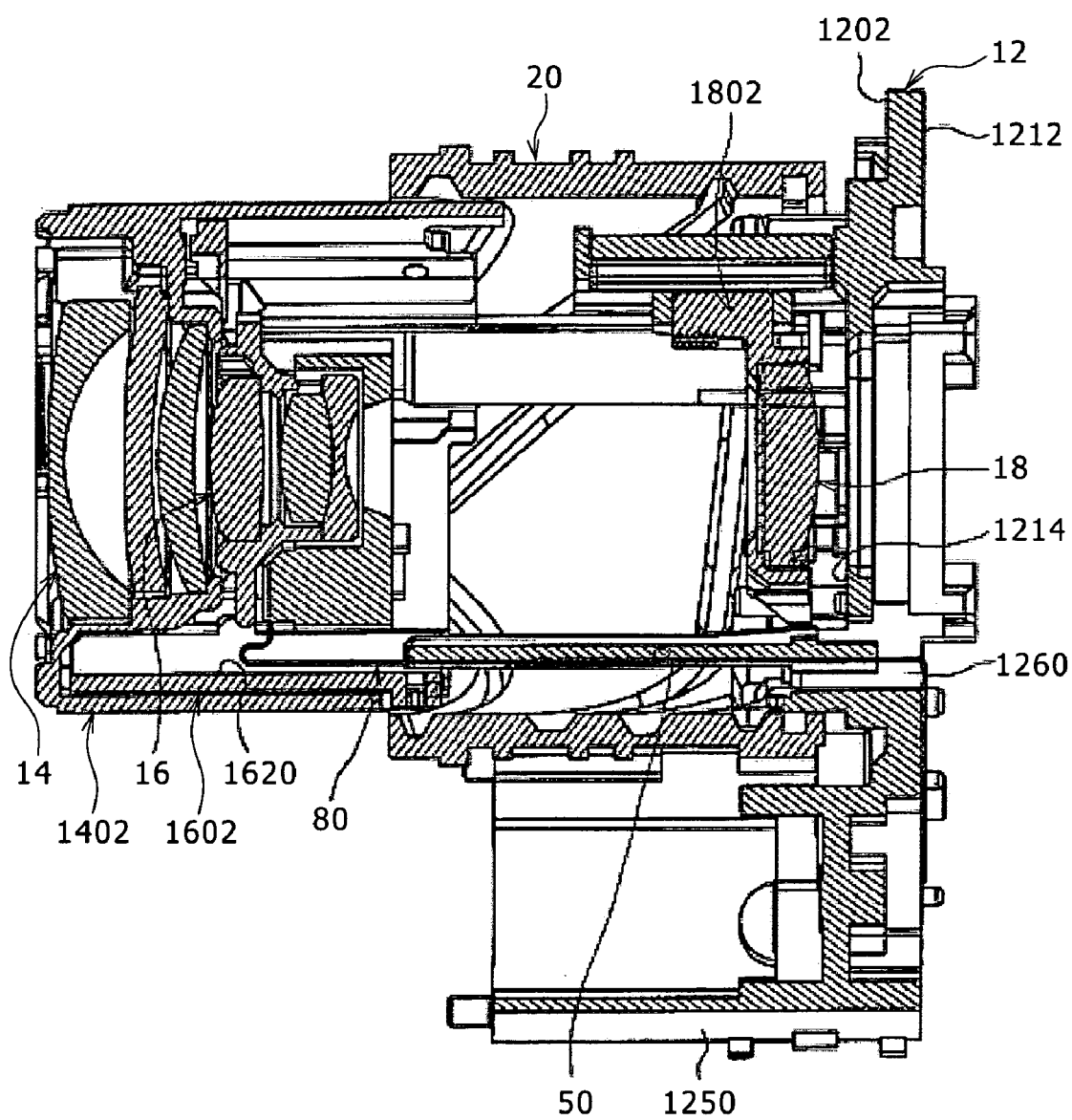
FIG. 33 is a sectional view of the lens-barrel showing the condition of the shutter flexible substrate 80 in the telephoto condition.

FIG. 31 is a sectional view of the lens-barrel showing the condition of the shutter flexible substrate 80 in the barrel retracted condition, FIG. 32 is a sectional view of the lens-barrel showing the condition of the shutter flexible substrate 80 in the wide angle condition, and FIG. 33 is a sectional view of the lens-barrel showing the condition of the shutter flexible substrate 80 in the telephoto condition.

FIG. 34A is an illustration showing the condition of the shutter flexible substrate 80 in the barrel retracted condition, and FIG. 34B is an illustration showing the condition of the shutter flexible substrate 80 in the wide angle condition.

Figure 36:
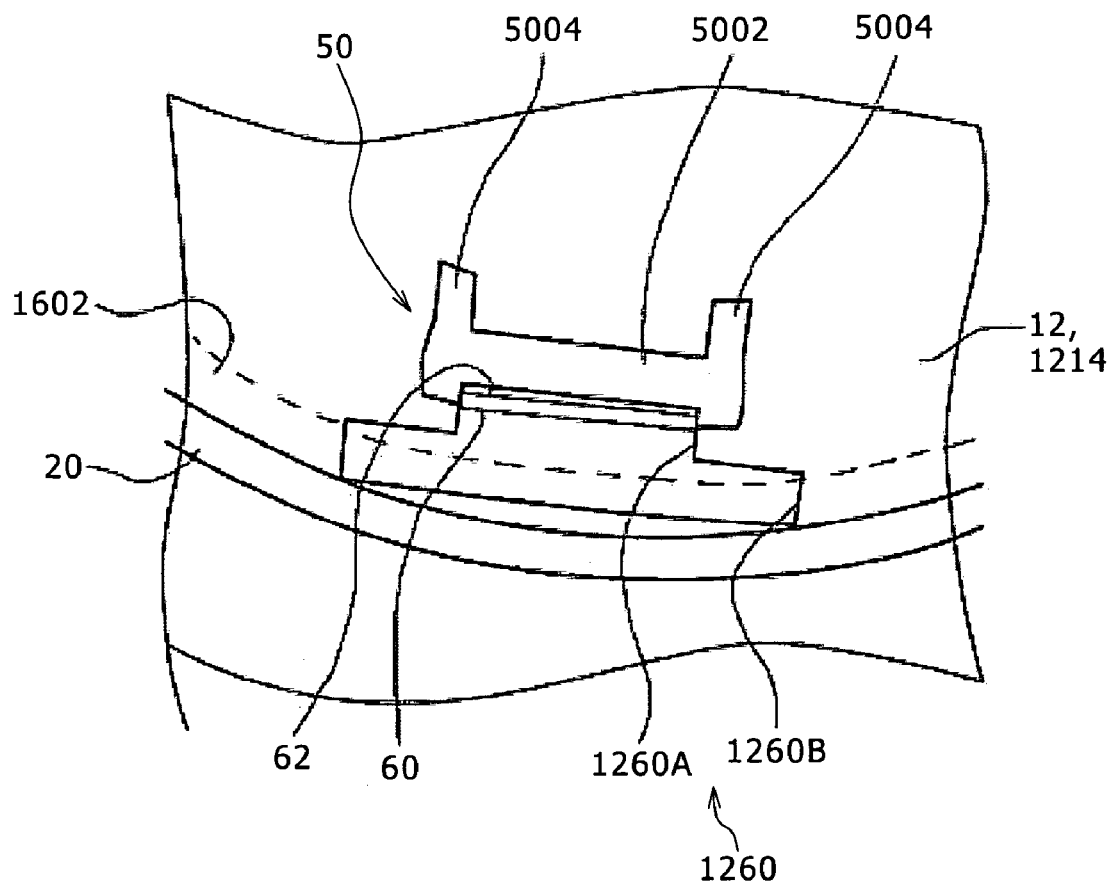
FIG. 36 is a plan view of the portion of the base 12 through which the shutter flexible substrate 80 is passed.

FIG. 35 is a perspective view showing the laying around of the shutter flexible substrate 80, and FIG. 36 is a plan view of the portion of the base 12 through which the shutter flexible substrate 80 is passed.

Figure 30:
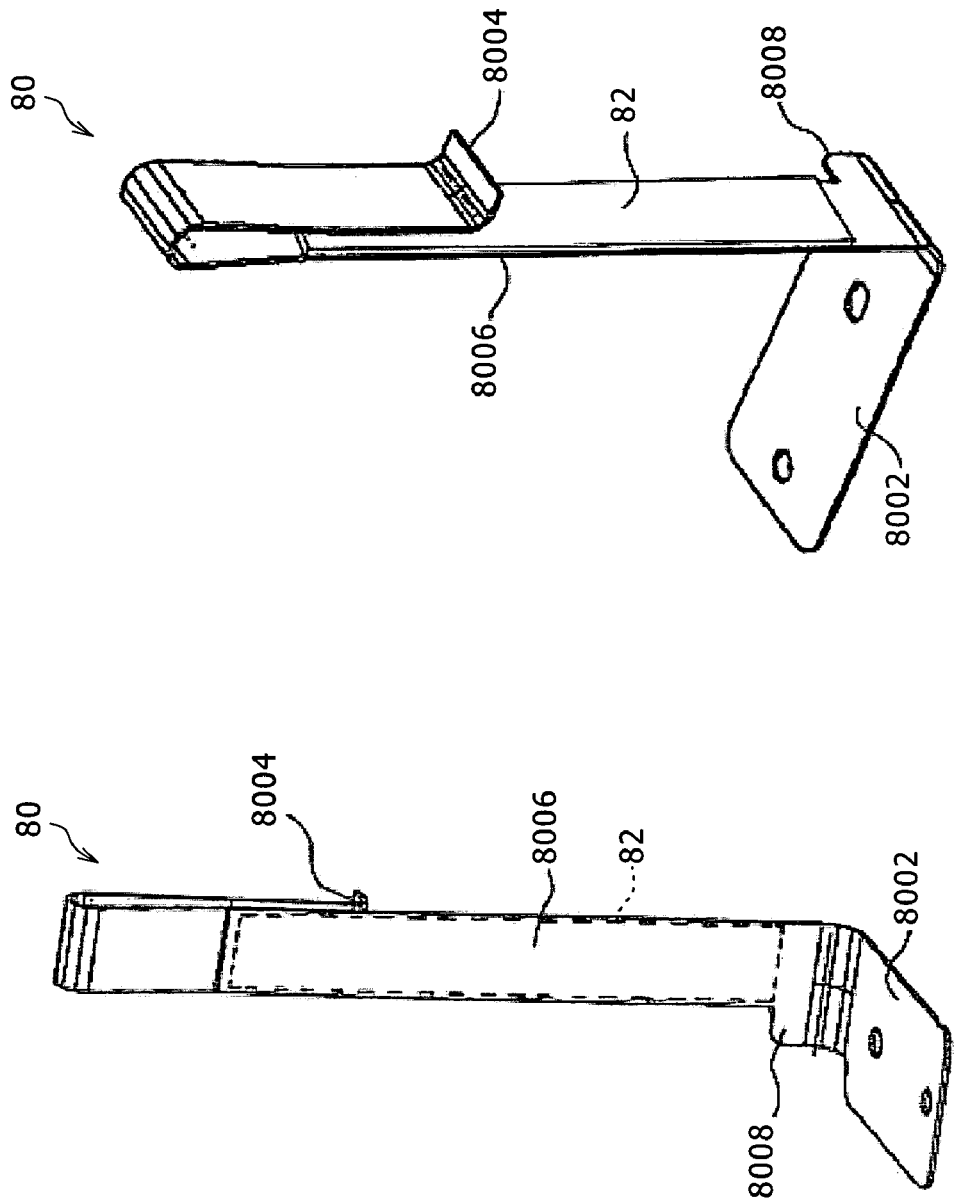
FIGS. 30A and 30B are perspective views of a shutter flexible substrate 80.

As shown in FIG. 30, the shutter flexible substrate 80 has a conductive pattern of a conductive material such as copper formed on a flexible insulating substrate, and is formed in a belt plate-like shape.

The shutter flexible substrate 80 is provided at its base end portion 8002 with a connection terminal electrically connected to the main flexible substrate 60, and is provided at its tip end portion 8004 with a connection terminal electrically connected to the electrical equipment part 19.

A connection portion 8006 having a uniform width is provided for connection between the base end portion 8002 and the tip end portion 8004, and a wide portion 8008 formed by bulging one of the width direction of the connection portion 8006 is provided at a portion, near the base end portion 8002, of the connection portion 8006.

A belt plate-like reinforcement plate 82 formed of a material (e.g., a synthetic resin) harder than the shutter flexible substrate 80 is adhered, by a double-faced adhesive tape or the like, to a portion ranging over a predetermined length from the boundary between the base end portion 8002 and the connection portion 8006, of one of the surfaces of the connection portion 8006.

As shown in FIG. 35, the reinforcement plate 82 is so configured that the upper end of the reinforcement plate 82 is located at a position nearer to the base 12 than the upper ends of the guide posts 50 in the condition where the shutter flexible substrate 80 is disposed along the guide posts 50. In other words, the reinforcement plate 82 is provided to have a length corresponding to the length of the guide posts 50, and is mounted to the shutter flexible substrate 80 so as to extend along the guide posts 50 at the position where the shutter flexible substrate 80 fronts on the surfaces of the guide posts 50.

Therefore, of the shutter flexible substrate 80, the portion to which the reinforcement plate 82 is adhered is maintained in the state of extending rectilinearly according to the shape of the reinforcement plate 82.

On the other hand, of the shutter flexible substrate 80, the portions to which the reinforcement plate 82 is not adhered, i.e., the base end portion 8002, the portion between the base end portion 8002 and the connection portion 8006, the portion of the connection portion 8006 near the tip end portion 8004, and the tip end portion 8004, are in a flexible state.

Now, the laying around of the shutter flexible substrate 80 will be described below.

As shown in FIG. 36, the portion of the base 12 where one guide post 50 of the three guide posts 50 is provided is provided with a through-hole 1260 for passing the flexible substrate therethrough.

The through-hole 1260 is provided on the outside of the guide post 50 directed in a radially outward direction of the cylindrical wall 1208.

The through-hole 1260 is composed of a narrow hole portion 1260A formed along a profile formed by a surface of the web 5002 of the guide post 50 and the inside surfaces of the flanges 5004 and having a width greater than the width of the connection portion 8006 of the shutter flexible substrate 80, and a wide hole portion 1260B connected to the narrow hole portion 1260A and having a width greater than the width of the wide portion 8008 of the shutter flexible substrate 80.

In laying around the shutter flexible substrate 80, as shown in FIG. 35, the tip end portion 8004 of the shutter flexible substrate 80 is inserted into the wide hole portion 1260B via the rear surface 1212 of the base 12. Then, the insertion is continued until the wide portion 8008 comes into abutment on a step portion 1262 provided in the base 12, and the connection portion 8006 is located at the narrow hole portion 1260A. This ensures that the shutter flexible substrate 80 is put into the state of extending forwards from the front surface 1214 of the base 12.

Thus, the connection portion 8006 of the shutter flexible substrate 80 led out to the front side of the base 12 is disposed along the surface of the guide post 50 fronting on the inner peripheral surface 1620 (see FIG. 34) of the second lens holding frame 1602, i.e., along the web 5002 between the both end flanges 5004 of the guide post 50. As a result, the shutter flexible substrate 80 extends along a space formed by the guide groove 1604 and the guide post 50. To be more specific, the shutter flexible substrate 80 extends along a space formed by the bottom surface 1604B of the guide groove 1604 of the second lens holding frame 1602 and the surface of the guide post 50 fronting on the bottom surface 1604B.

Next, the connection terminal at the base end portion 8002 of the shutter flexible substrate 80 is electrically connected and fixed to the main flexible substrate 60 by soldering or the like, as will be described later. To be more specific, the base end portion 8002 is fixed to the rear surface 1212 of the base 12 through the main flexible substrate 60, and the portion of the rear surface 1212 of the base 12 where the base end portion 8002 is fixed is located on the outer side, in the radial direction of the cylindrical wall 1208, relative to the guide post 50.

Therefore, the portion at the boundary between the connection portion 8006 and the base end portion 8002 is bent by 90 degrees as shown in FIG. 30, and a reaction force generated at the bent boundary portion biases the connection portion 8006 in the direction of pressing against the side of the surface of the guide post 50 (the surface of the web 5002).

In addition, the connection terminal at the tip end portion 8004 of the shutter flexible substrate 80 is electrically connected and fixed to the electrical equipment part 19 by soldering or the like.

By this, the laying around of the shutter flexible substrate 80 is completed.

As shown in FIGS. 31 and 34A, when the lens-barrel 10 is in the barrel retracted condition, the second lens holding frame 1602 is located at a position nearest to the base 12, so that the portion near the base end portion 8002 of the connection portion 8006 of the shutter flexible substrate 80 extends along the space formed by the guide groove 1604 and the guide post 50, an intermediate portion in the longitudinal direction of the connection portion 8006 is bent by 180 degrees at the front end of the guide post 50, and the portion near the tip end portion 8004 of the connection portion 8006 is in the state of extending in the direction of the base 12.

In other words, the portion near the tip end portion 8004 of the shutter flexible substrate 80 is bent back at the front end of the guide post 50, and extends toward the base 12 side along the surface of the guide post 50 located on the opposite side of the surface of the guide post 50 fronting on the inner peripheral surface 1620 of the second lens holding frame 1602.

As shown in FIG. 32, when the lens-barrel 10 is moved from the barrel retracted condition to the wide angle condition, the second lens holding frame 1602 is slightly moved forwards, the portion bent by 180 degrees (the portion fronting on the front end of the guide post 50) is moved forwards from the front end of the guide post 50 by an amount corresponding to the forward movement of the tip end portion 8004 of the shutter flexible substrate 80.

As shown in FIGS. 33 and 34B, when the lens-barrel 10 is moved from the wide angle condition to the telephoto condition, the portion bent by 180 degrees (the portion fronting on the front end of the guide post 50) is largely moved forwards from the front end of the guide post 50 by an amount corresponding to the forward movement of the tip end portion 8004 of the shutter flexible substrate 80.

In this case, due to the elasticity of the shutter flexible substrate 80, the connection portion 8006 located on the tip side relative to the front end of the guide post 50 extends rectilinearly along the extension direction of the surface of the web 5002 of the guide post 50, i.e., along the inner peripheral surface 1620 of the second lens holding frame 1602 forwards from the front end of the guide post 50.

Incidentally, when the lens-barrel 10 is moved from the telephoto condition to the wide angle condition or when the lens-barrel 10 is moved from the wide angle condition to the barrel retracted condition, the shutter flexible substrate 80 is moved in the sequence reverse to the above.

With such a configuration, the guide posts 50 extending in the axial direction and fronting on the inner peripheral surface 1620 of the second lens holding frame 1602 are erected on the base 12, the shutter flexible substrate 80 is extended from the base 12 along the surface of the guide post 50 fronting on the inner peripheral surface 1620 of the second lens holding frame 1602, and its tip end portion 8004 is connected to the electrical equipment part 19, so that the shutter flexible substrate 80 is maintained in the state of being along the guide post 50 even if the second lens holding frame 1602 is moved. Therefore, the portion of the shutter flexible substrate 80 does not interfere with the second lens holding frame 1602, and the space occupied by the shutter flexible substrate 80 can be maintained at minimum while securing smooth movements of the lens holding frame, which is advantageous in contriving a reduction in the size of the lens-barrel 10 and, hence, advantageous in contriving a reduction in the size of the image pickup apparatus 100. In addition, the shutter flexible substrate 80 extends along the space defined by the bottom surface 1604B of the guide groove 1604 of the second lens holding frame 1602 and the surface of the guide post 50 fronting on the bottom surface 1604, which is advantageous in reducing the occupied space.

Besides, since the reinforcement plate 82 is mounted to one of the surfaces of the connection portion 8006 of the shutter flexible substrate 80, the connection portion 8006 can keep the posture along the surface of the guide post 50 even when a force in the direction of bending (compressing) the connection portion 8006 is exerted due to the movement of the second lens holding frame 1602, so that the shutter flexible substrate 80 can be prevented from interfering with the second lens holding frame 1602, which is advantageous for smoothly moving the second lens holding frame 1602.

In addition, the three guide posts 50 are projected on the base 12 in parallel to the axial direction and at intervals along the circumferential direction of the cam ring 20, and the engagement of the inner peripheral portion of the second lens holding frame 1602 with each guide post 50 ensures that the second lens holding frame 1602 is supported by the guide posts 50 so as to be non-rotatable in the radial direction and be movable in the axial direction, so that the component members of the image pickup apparatus such as the guide shafts 1216 and 1218 and the magnet 4002 can be disposed, for example as shown in FIG. 27, by utilizing the space on the circle circumference having its center on the optical axis and passing through the guide posts 50 and between the guide posts 50, which is advantageous for reducing the diametral size of the lens-barrel 10 and for reducing the size of the image pickup apparatus 100, as compared with the case where a rectilinear movement guide ring is disposed between the outer periphery of the first and second lens holding frames 1402 and 1602 and the inner periphery of the cam ring 20. In addition, in the case of assembling the first and second lens holding frame 1402 and 1602 into the base 12, the second lens holding frame 1602 is inserted in the direction of the base 12 while engaging the guide groove 1604 of the second lens holding frame 1602 with each guide post 50 on the base 12, and the first lens holding frame 1402 is inserted in the direction of the base 12 while engaging the guide groove 1406 of the first lens holding frame 1402 with each guide portion 1608, so that the assemblage of the first and second lens holding frames 1402 and 1602 can be carried out easily. Besides, in the barrel retracted condition of the lens-barrel 10, the first cam pin 1412 of the first lens holding frame 1402 and the second cam pin 1610 of the second lens holding frame 1602 are locates at substantially the same position in the optical axis direction and at positions spaced from each other in the circumferential direction, so that the first and second cam pins 1412 and 1610 can be simultaneously inserted into the first and second cam grooves 2010 and 2012 via the first and second open grooves 2010A and 2012A of the cam ring 20, which is advantageous in simplifying the assembling operation, as compared with the related-art case where one of the cam pins is inserted into the cam groove, then the cam ring 20 is rotated one revolution and thereafter the other of the cam pins is inserted into the cam groove.

In addition, the section of the guide post 50 is in an I shape composed of the web 5002 and the flanges 5004 at both ends of the web 5002, which is advantageous in reducing the space occupied by the guide posts 50 while securing the strength of the guide posts 50. Besides, the outside surfaces 5004A of the flanges 5004 at both ends constituting the guide post 50 are engaged with the side surfaces 1604A of the guide groove 1604 in the second lens holding frame 1602, and the end faces 5004B of the both end flanges 5004 are engaged with the bottom surface 1604B of the guide groove 1604, so that a dead space is formed between the portion of the web 5002 and the bottom surface 1604B of the guide groove 1604. Therefore, in the case where the tip end portion in the pressing-in direction of the second cam pin 1610 is projected from the inner peripheral surface of the second lens holding frame 1602 due to the pressing-in of the second cam pin 1610 into the portion of the second lens holding frame 1602 fronting on the radially outer side of the guide groove 1604, the tip end portion is contained in the dead space, which is advantageous in contriving a reduction in the diametral size of the lens-barrel 10 by effective utilization of the dead space relating to the guide posts 50.

Now, a connection structure for the main flexible substrate 60, the coil flexible substrate 4008, and the shutter flexible substrate 80 which are major parts in the present invention will be described below.

Figure 37:
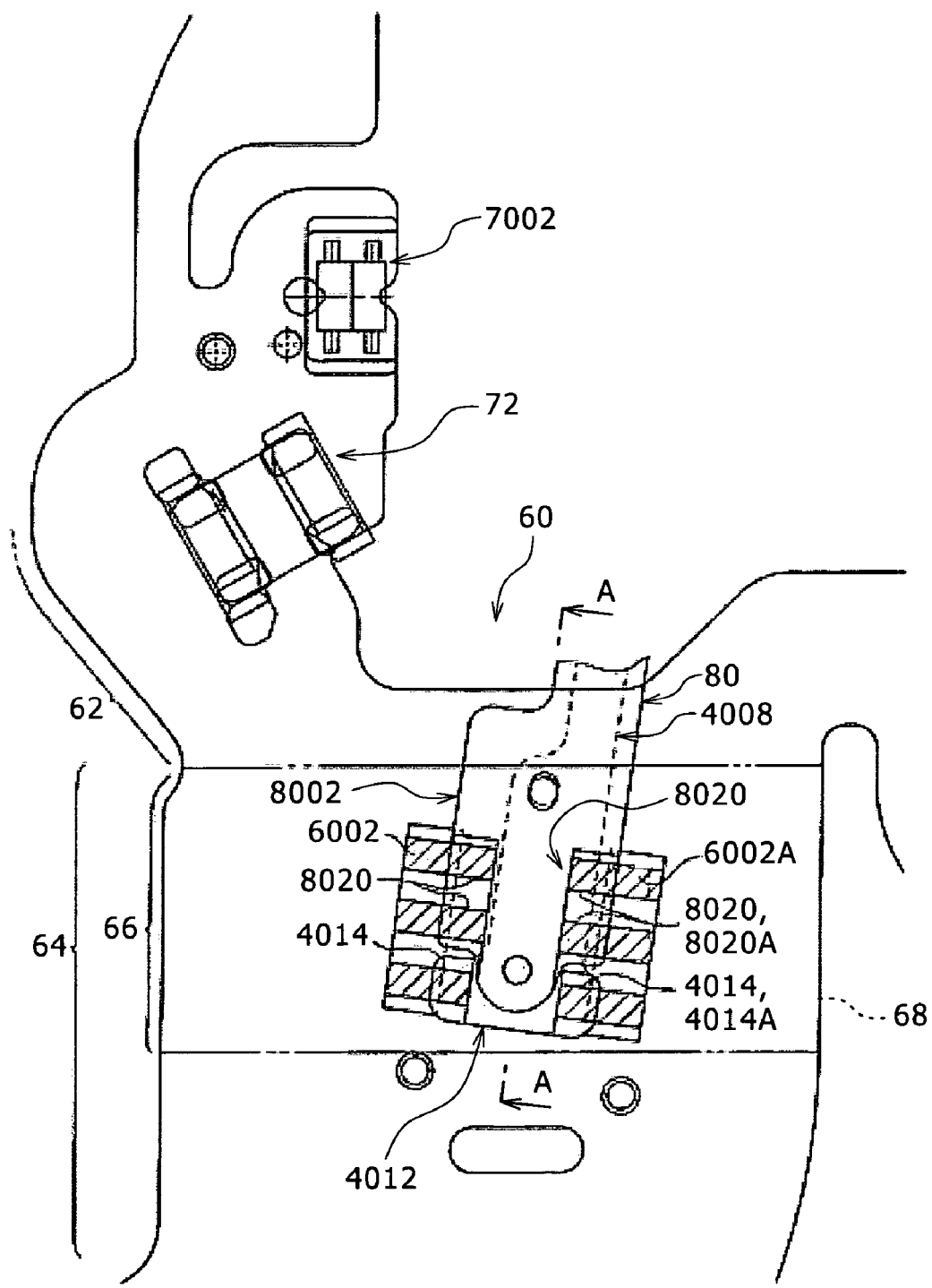
FIG. 37 is a plan view showing the positional relationships of a main flexible substrate 60, a coil flexible substrate 4008, and the shutter flexible substrate 80.
Figure 38A:
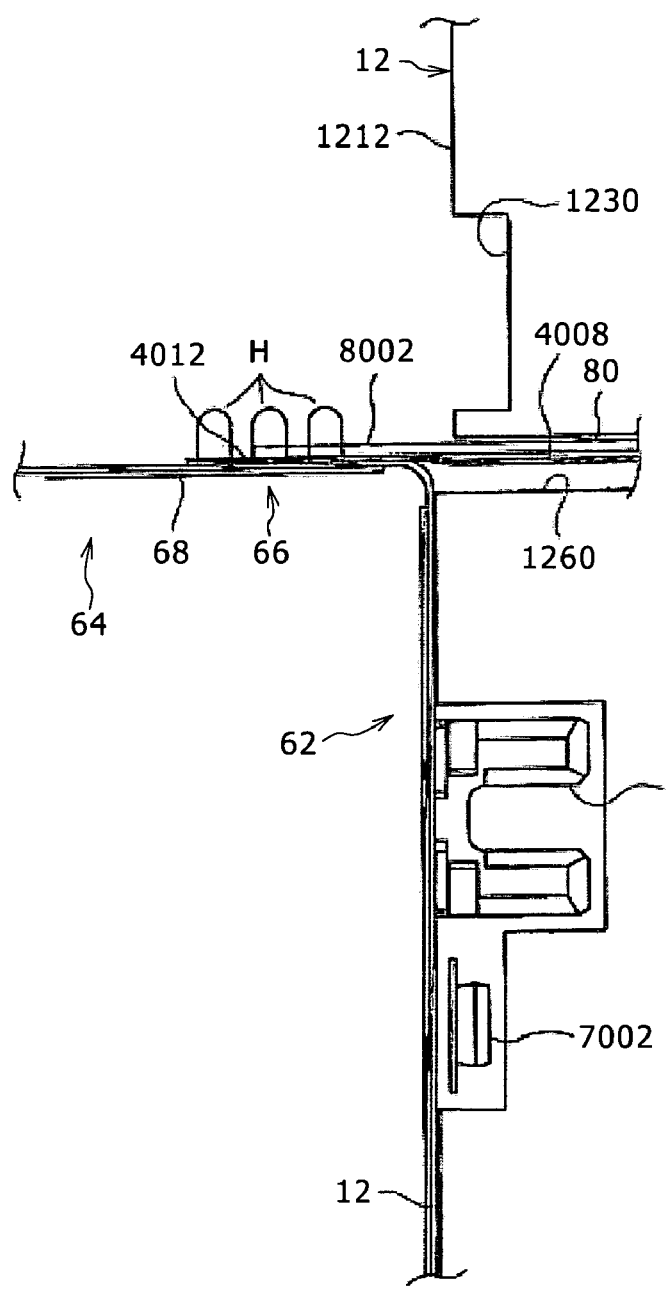
Figure 38B:
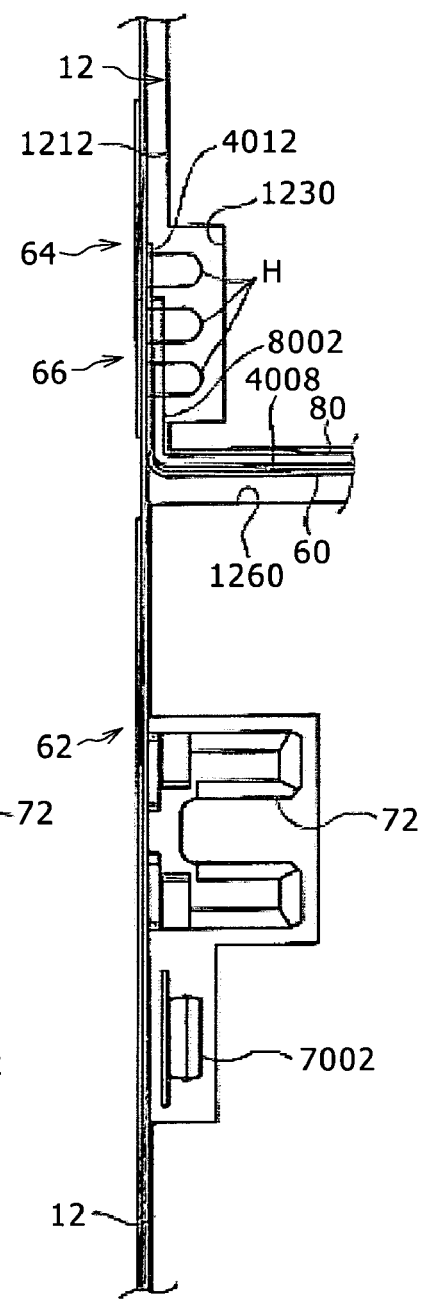
Figure 39:
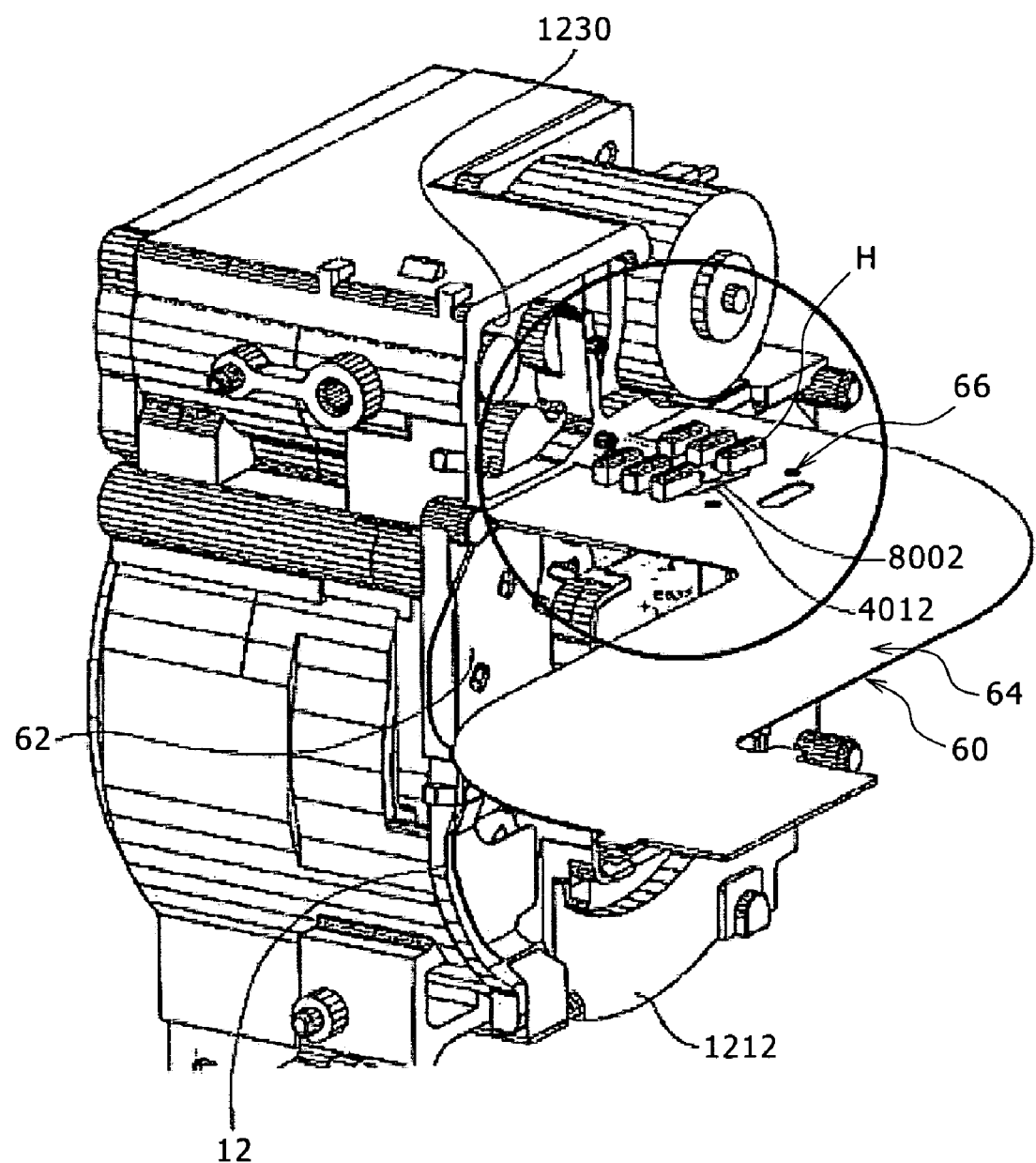
FIG. 39 is a perspective view showing the bent state of the undulatable surface portion of the main flexible substrate 60.
Figure 40:
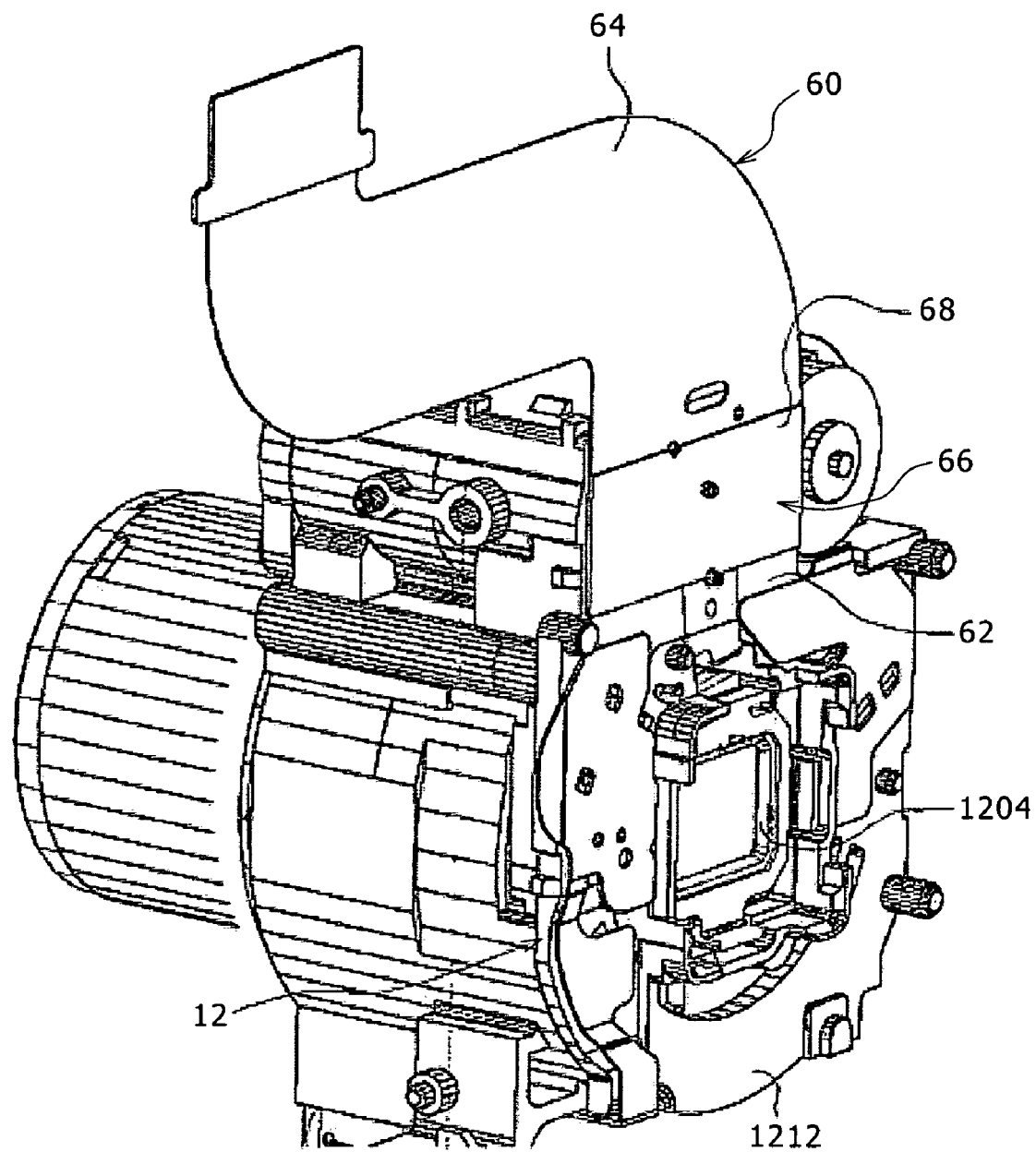
FIG. 40 is a perspective view showing the flat state of the undulatable surface portion of the main flexible substrate 60.
Figure 41:
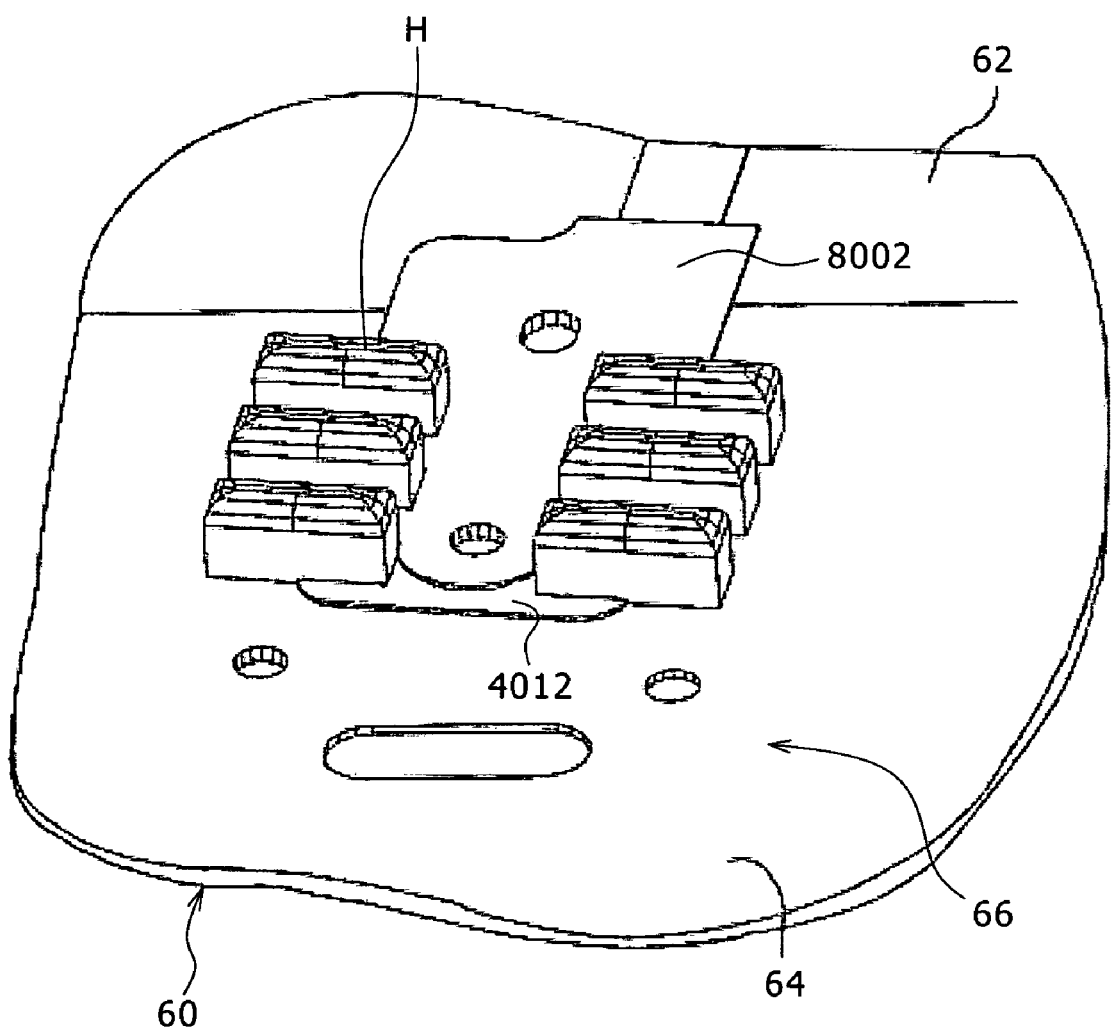
FIG. 41 is a perspective view showing the soldered state of first and second soldered terminal portions.

FIG. 37 is a plan view showing the positional relationships of a main flexible substrate 60, a coil flexible substrate 4008, and the shutter flexible substrate 80, FIGS. 38A and 38B are sectional views along line A-A of FIG. 37, in which FIG. 38A shows the bent state of an undulatable surface portion of the main flexible substrate 60, and FIG. 38B shows the flat state of the undulatable surface portion of the main flexible substrate 60, FIG. 39 is a perspective view showing the bent state of the undulatable surface portion of the main flexible substrate 60, FIG. 40 is a perspective view showing the flat state of the undulatable surface portion of the main flexible substrate 60, and FIG. 41 is a perspective view showing the soldered state of first and second soldered terminal portions.

First, the main flexible substrate 60 will be described.

The main flexible substrate 60 is composed of a flexible insulating substrate, and a conductive pattern formed on the insulating substrate, and has a mount surface portion 62 to be mounted to the rear surface 1212 of the base 12, and a movable surface portion 64 extended from the mount surface portion 62, as shown in FIG. 9.

As shown in FIG. 37, in addition to the above-mentioned Hall element 7002, a photo-interrupter 72 for detecting a detection piece 2020 (see FIG. 8) provided at the rear end of the cam ring 20 along the circumferential direction of the cam ring 20 is mounted on the mount surface portion 62.

The photo-interrupter 72 is so disposed as to project forwards from the front surface 1214 of the base 12 through an opening (not shown) in the base 12 and front on the detection piece 2020 of the cam ring 20 in the condition where the main flexible substrate 60 is mounted to the rear surface 1212 of the base 12.

A detection signal obtained in the photo-interrupter 72 is supplied through the main flexible substrate 60 to the control unit 148, and the control unit 148 discriminates the rotational position of the cam ring 20 based on the detection signal.

At the portion of the movable surface portion 64 near the mount surface portion 62, there is formed an undulatable surface portion 66 undulatable between a bent state (FIGS. 38A and 39) of being bent at right angles relative to the mount surface portion 62 and separate from the rear surface 1212 of the base 12 and a flat state (FIGS. 38B and 39) of being mated and mounted to the rear surface 1212 of the base 12.

A first soldered terminal portion 6602 is formed on the front surface of the undulatable surface portion 66 fronting on the rear surface 1212 of the base. In this example, a total of six connection terminals 6602A are formed in two rows spaced in the direction orthogonal to a straight line, each row including three connection terminals 6602A arranged at intervals along the straight line.

A reinforcement plate 68 formed of a material harder than the above-mentioned insulating substrate and having a size corresponding to the undulatable surface portion 66 is mounted to the rear surface on the opposite side of the front surface where the undulatable surface portion 66 fronts on the rear surface 1212 of the base 12.

Now, the shutter flexible substrate 80 will be described below.

A base end portion 8002 (the rear end) of the shutter flexible substrate 80 is extended through the through-hole 1260 (corresponding to the opening in the claims) in the base 12 to the rear side of the rear surface 1212 of the base 12, as has been described above.

The base end portion 8002 of the shutter flexible substrate 80 is provided with a second soldered terminal portion 8020. In this example, a total of four connection terminals 8020A are formed in the condition where two connection terminals 8020A are formed on each of both sides in the width direction of the base end portion 8002.

Now, the coil flexible substrate 4008 will be described below.

Like in the case of the shutter flexible substrate 80, a base end portion 4012 of the coil flexible substrate 4008 is extended through he through-hole 1260 to the rear side of the rear surface 1212 of the base 12.

The base end portion 4012 of the coil flexible substrate 4008 is provided with a second soldered terminal portion 4014. In this example, a total of two connection terminals 4014A are formed in the condition where one connection terminal 4014A is formed on each of both sides in the width direction of the base end portion 4012.

Now, the soldering of the main flexible substrate 60 to the shutter flexible substrate 80 and the coil flexible substrate 4008 will be described below.

First, as shown in FIGS. 38A and 39, the undulatable surface portion 66 is put into the bent state.

In this condition, each of the connection terminals 4014A of the second soldered terminal portion 4014 of the coil flexible substrate 4008 is overlappingly soldered onto each of the connection terminals 6602A of the first soldered terminal portion 6602 of the undulatable surface portion 66.

Next, each of the connection terminals 8020A of the second soldered terminal portion 8020 of the shutter flexible substrate 80 is overlappingly soldered onto each of the connection terminals 6602A of the first soldered terminal portion 6602 of the undulatable surface portion 66 from the upper side of the coil flexible substrate 4008 in the condition where the rear end of the second soldered terminal portion 4014 of the coil flexible substrate 4008 is exposed.

As a result, as shown in FIG. 41, a solder H is present between the connection terminals 4014A and 6002A, the solder is also present between the connection terminals 8020A and 6002A, and, then, the main flexible substrate 60 is electrically connected to the shutter flexible substrate 80 and the coil flexible substrate 4008.

Subsequently, as shown in FIGS. 38B and 40, the undulatable surface portion 66 is bent into the flat state, then, as shown in FIG. 9, a fixture metal 74 is abutted on the mount surface portion 62 and the rear surface of the undulatable surface portion 66, and engaging recessed portions 7402 provided on both sides of the fixture metal 74 are engaged with engaging projected portions 1232 on both sides of the base 12, whereby the mounting of the main flexible substrate 60 onto the base 12 is completed.

In this condition, the solder H is located between the front surface of the main flexible substrate 60 and the rear surface 1212 of the base 12, so that the solder H is covered with the insulating substrate of the main flexible substrate 60 and is therefore not exposed to the outside.

Incidentally, in this example, the rear surface 1212 of the base 12 is provided with a recessed portion 1230, and the solder H soldered to the second soldered terminal portions 6002, 4014 and 8020 is contained in the recessed portion 1230.

According to this example, the main flexible substrate 60 is provided with the undulatable surface portion 66, the front surface of the undulatable surface portion 66 fronting on the rear surface 1212 of the base 12 is provided with the first soldered terminal portion 6002, and the shutter flexible substrate 80 and the coil flexible substrate 4008 are provided respectively with the second soldered terminal portions 4014 and 8020 at the rear ends thereof.

Therefore, the second soldered terminal portions 4014 and 8020 of the shutter flexible substrate 80 and the coil flexible substrate 4008 can be overlappingly soldered onto the first soldered terminal portion 6002 of the undulatable surface portion 66 in the condition where the undulatable surface portion 66 is in the bent state, which is advantageous in simplifying the assembling operation.

In addition, with the undulatable surface portion 66 in the flat state, the solder H is covered by the main flexible substrate 60 and is not exposed to the outside, there is no need, unlike in the related art, to secure a space for preventing the portion of the solder H from making contact with other members, which is advantageous in contriving a reduction in size. Besides, there is no need for applying a member such as an insulating tape to the portion of the solder H, which is advantageous in contriving reductions in the number of component parts and in cost.

Besides, in this example, since the reinforcement plate 68 having a size corresponding to the undulatable surface portion 66 is mounted to the undulatable surface portion 66, the bending of the undulatable surface portion 66 can be performed assuredly, and flatness can be secured when the undulatable surface portion 66 is bent, which is advantageous in efficiently carrying out the soldering operation.

In addition, in this example, since the rear surface 1212 of the base 12 is provided with the recessed portion 1230 for containing the solder H, the portion of the solder H on the undulatable surface portion 66 does not occupy the space on the rear side ranging from the rear surface 1212 of the base 12 when the undulatable surface portion 66 is in the flat state, which is advantageous in contriving a reduction in size.

Incidentally, while the case of overlappingly soldering each of the connection terminals 8020A of the second soldered terminal portion 8020 of the shutter flexible substrate 80 onto each of the connection terminals 6002A of the first soldered terminal portion 6002 of the undulatable surface portion 66 from the upper side of the coil flexible substrate 4008 in the condition where the rear end of the second soldered terminal portion 4014 of the coil flexible substrate 4008 is exposed has been described in this example, the portion to be exposed may be a portion other than the rear end of the second soldered terminal portion 4014 of the coil flexible substrate 4008.

In addition, while the case where two flexible substrates consisting of the shutter flexible substrate 80 and the coil flexible substrate 4008 are provided as the electrical equipment part flexible substrate has been described in this example, only one electrical equipment part flexible substrate may be adopted, or three or more electrical equipment part flexible substrates may be adopted, in the present invention, naturally.

Besides, the digital still camera has been used as the image pickup apparatus in the description of this example, the present invention is applicable to various other image pickup apparatuses such as video camera.

It should be understood by those skilled in the art that various modifications, combinations, sub-combinations and alterations may occur depending on design requirements and other factors insofar as they are within the scope of the appended claims or the equivalents thereof.

What is claimed is:

1. A lens-barrel comprising:
   a frame for holding a lens, the frame having a front end and a rear end;
   an electrical part provided in the frame;
   a base provided on the rear end of the frame for supporting the frame in such way that the lens is movable in an axial direction, the base having an opening and a recess;
   an electrical part flexible substrate inside the frame, having a front end connected to the electrical part and having a rear end extending rearwards;
   a main flexible substrate outside the frame, including a mounting surface portion mounted to the rear surface of the base, and a movable surface portion extending from the mounting surface portion, the movable surface portion including an undulatable surface portion near the mounting surface portion, undulatable between a bent state in which the undulatable surface portion is bent relative to the mounting surface portion and is kept apart from the rear surface of the base and a flat state in which the undulatable surface portion is flattened and mounted to the rear surface of the base,
   the lens barrel being made by a process comprising:
   bending the undulatable surface portion of the movable surface portion of the main flexible substrate to expose the opening and the recess of the base,
   pulling out the rear end of the electrical part flexible substrate through the opening of the base,
   soldering the rear end of the electrical part flexible substrate to the undulatable surface portion, and
   flattening the undulatable surface portion and mounting it to the rear surface of the base to shelter the solders in the isolated space enclosed by the recess of the base and the undulatabe surface portion.

2. The lens-barrel as set forth in claim 1,
   wherein the main flexible substrate further comprises a flexible insulating substrate, a conductive pattern formed on the insulating substrate, and a reinforcement plate made of materials harder than the insulating substrate and having a size corresponding to the undulatable surface portion, and
   wherein the reinforcement plate is mounted to the insulating substrate.

3. The lens-barrel as set forth in claim 1,
   wherein two electrical part flexible substrates are provided, and
   wherein the rear ends of the two electrical part flexible substrates are soldered to the undulatable surface portion, the solders of one of the two electrical part flexible substrates partially or completely overlapping the solders of the other.

4. An image pickup apparatus comprising a lens-barrel, a lens for acquiring an image, and an image pickup device for capturing the image,
   wherein the lens-barrel includes:
   a frame for holding the lens, the frame having a front end and a rear end;
   an electrical part provided in the frame;
   a base provided on the rear end of the frame for supporting the frame in such way that the lens is movable in an axial direction, the base having an opening and a recess;
   an electrical part flexible substrate inside the frame, having a front end connected to the electrical part and having a rear end extending rearwards;
   a main flexible substrate outside the frame, including a mounting surface portion mounted to the rear surface of the base, and a movable surface portion extending from the mounting surface portion, the movable surface portion including an undulatable surface portion near the mounting surface portion, undulatable between a bent state in which the undulatable surface portion is bent relative to the mounting surface portion and is kept apart from the rear surface of the base and a flat state in which the undulatable surface portion is flattened and mounted to the rear surface of the base,
   the lens barrel being made by a process comprising:
   bending the undulatable surface portion of the movable surface portion of the main flexible substrate to expose the opening and the recess of the base,
   pulling out the rear end of the electrical part flexible substrate through the opening of the base,
   soldering the rear end of the electrical part flexible substrate to the undulatable surface portion,
   and flattening the undulatable surface portion and mounting it to the rear surface of the base to shelter the solders in the isolated space enclosed by the recess of the base and the undulatable surface portion.

5. The image pickup apparatus as set forth in claim 4,
   wherein the main flexible substrate further comprises a flexible insulating substrate, a conductive pattern formed on the insulating substrate, and a reinforcement plate made of materials harder than the insulating substrate and having a size corresponding to the undulatable surface portion, and
   wherein the reinforcement plate is mounted to the insulating substrate.

6. The image pickup apparatus as set forth in claim 4,
   wherein two electrical part flexible substrates are provided, and
   wherein the rear ends of the two electrical part flexible substrates are soldered to the undulatable surface portion, the solders of one of the two part flexible substrates partially or completely overlapping the solders of the other.

7. A method for mounting a first flexible substrate to the exterior surface of a lens barrel's base and connecting the first flexible substrate to a second flexible substrate inside the lens barrel, the method comprising the steps of:

forming an opening and an inward-projecting recess in the base, mounting a portion of the first flexible substrate to the exterior surface of the lens barrel's base, bending a portion of the first flexible substrate that is not yet mounted to expose the opening and the recess of the base, pulling out the rear end of the second flexible substrate through the opening of the base, soldering the rear end of the second flexible substrate to the bent portion of the first flexible substrate, and flattening the bent portion of the first flexible substrate and mounting it to the exterior surface of the base to shelter the solders in the isolated space enclosed by the recess of the base and the first flexible substrate.

* * * * *